United States Patent [19]
Saeki et al.

[11] Patent Number: 5,160,902
[45] Date of Patent: Nov. 3, 1992

[54] VOLTAGE CONTROLLED OSCILLATOR WITH CONTROLLED CAPACITANCE RATIO IN POSITIVE FEEDBACK LOOP TO BROADEN BANDWIDTH

[75] Inventors: Hiroshi Saeki, Atsugi; Hatsuo Motoyama, Tokyo, both of Japan

[73] Assignee: Anritsu Corporation, Tokyo, Japan

[21] Appl. No.: 727,839

[22] Filed: Jul. 9, 1991

Related U.S. Application Data
[62] Division of Ser. No. 570,048, Aug. 20, 1990.

[30] Foreign Application Priority Data
| Aug. 25, 1989 | [JP] | Japan | 1-217261 |
| Sep. 21, 1989 | [JP] | Japan | 1-243434 |
| Sep. 25, 1989 | [JP] | Japan | 1-246532 |
| Mar. 30, 1990 | [JP] | Japan | 2-83049 |

[51] Int. Cl.$^5$ .......................... H03B 5/00
[52] U.S. Cl. ................... 331/117 R; 331/177 V
[58] Field of Search ........... 331/117 R, 117 FE, 167, 331/177 R, 177 V

[56] References Cited
U.S. PATENT DOCUMENTS
| 3,902,132 | 8/1975 | Fried | 331/15 |
| 4,593,255 | 6/1986 | Matsuura | 331/117 R |
| 4,603,304 | 7/1986 | Burns et al. | 331/2 |

FOREIGN PATENT DOCUMENTS
61-16623  1/1986  Japan.

OTHER PUBLICATIONS
"8662A Synthesized Signal Generator", Hewlett Packard Service Manual, Jan. 1980.

*Primary Examiner*—Robert J. Pascal
*Attorney, Agent, or Firm*—Frishauf, Holtz, Goodman & Woodward

[57] ABSTRACT

A voltage controlled oscillator comprises a resonant circuit having at least a coil and a first variable capacitance diode, and resonating within predetermined variable frequency ranges; and an active circuit having an input, an output, and an active element connected between the input and the output, the input being connected to the resonant circuit in order to receive a resonant output therefrom. A variable capacitance ratio circuit, having a second variable capacitance diode and at least one capacitor, is connected in a positive feedback manner, between the input and the output of said active circuit means in order to oscillate the active element of the active circuit at a resonant frequency of the resonant circuit, between the input and the output of the active circuit. A variable controller is provided for changing a resonant frequency of the resonant circuit, to thereby apply a control voltage to the first and second variable capacitance diodes and to control a capacitance ratio between the at least one capacitor and the second variable capacitance diode in the variable capacitance ratio circuit, so that an oscillator frequency of the active element can be changed substantially linearly over a wide bandwidth of no less than one octachord in accordance with a variation in the control voltage, to thereby retain the amount of positive feedback at a predetermined level against the oscillator frequency of the active circuit.

9 Claims, 28 Drawing Sheets

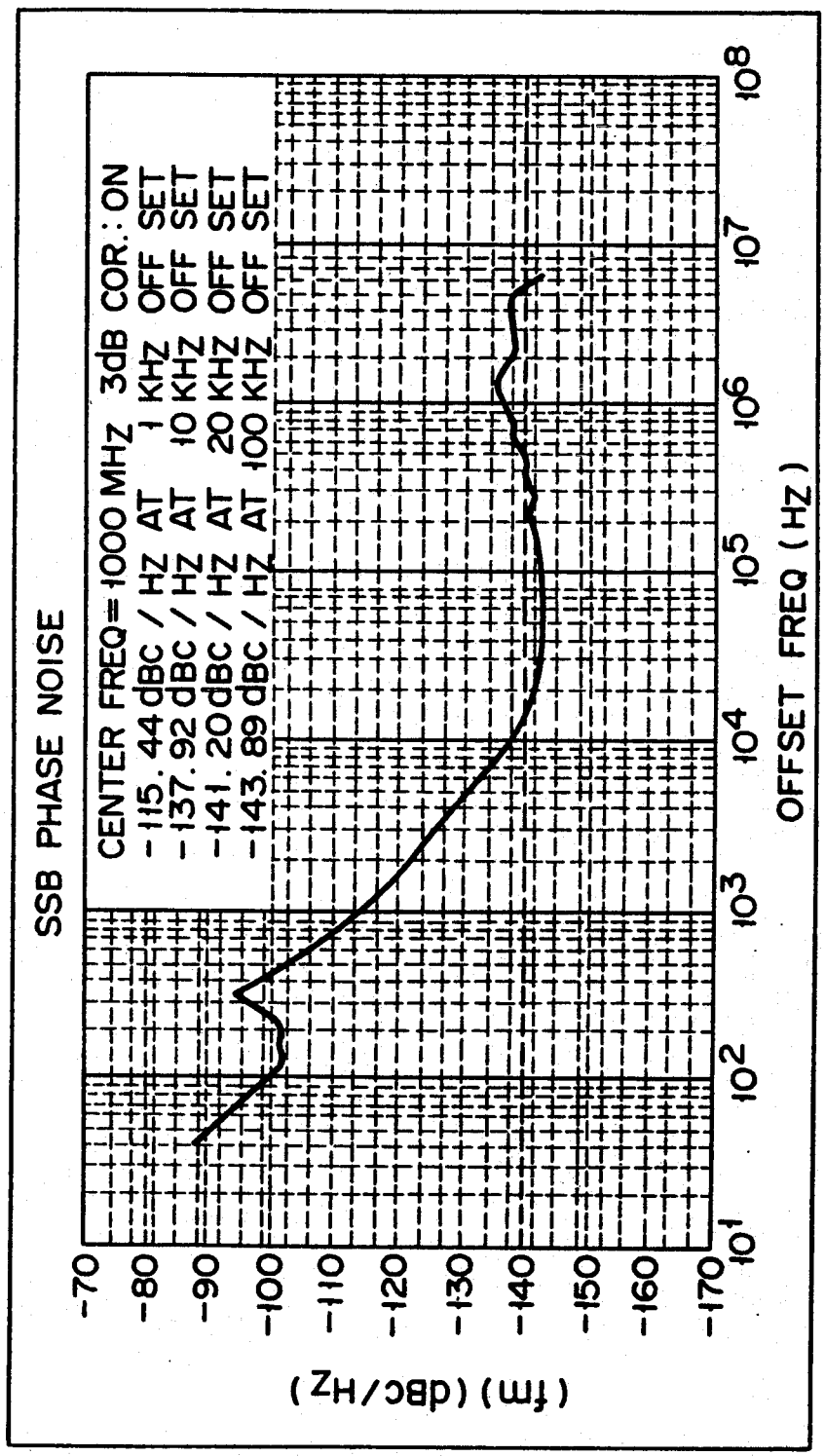
F I G. 3A

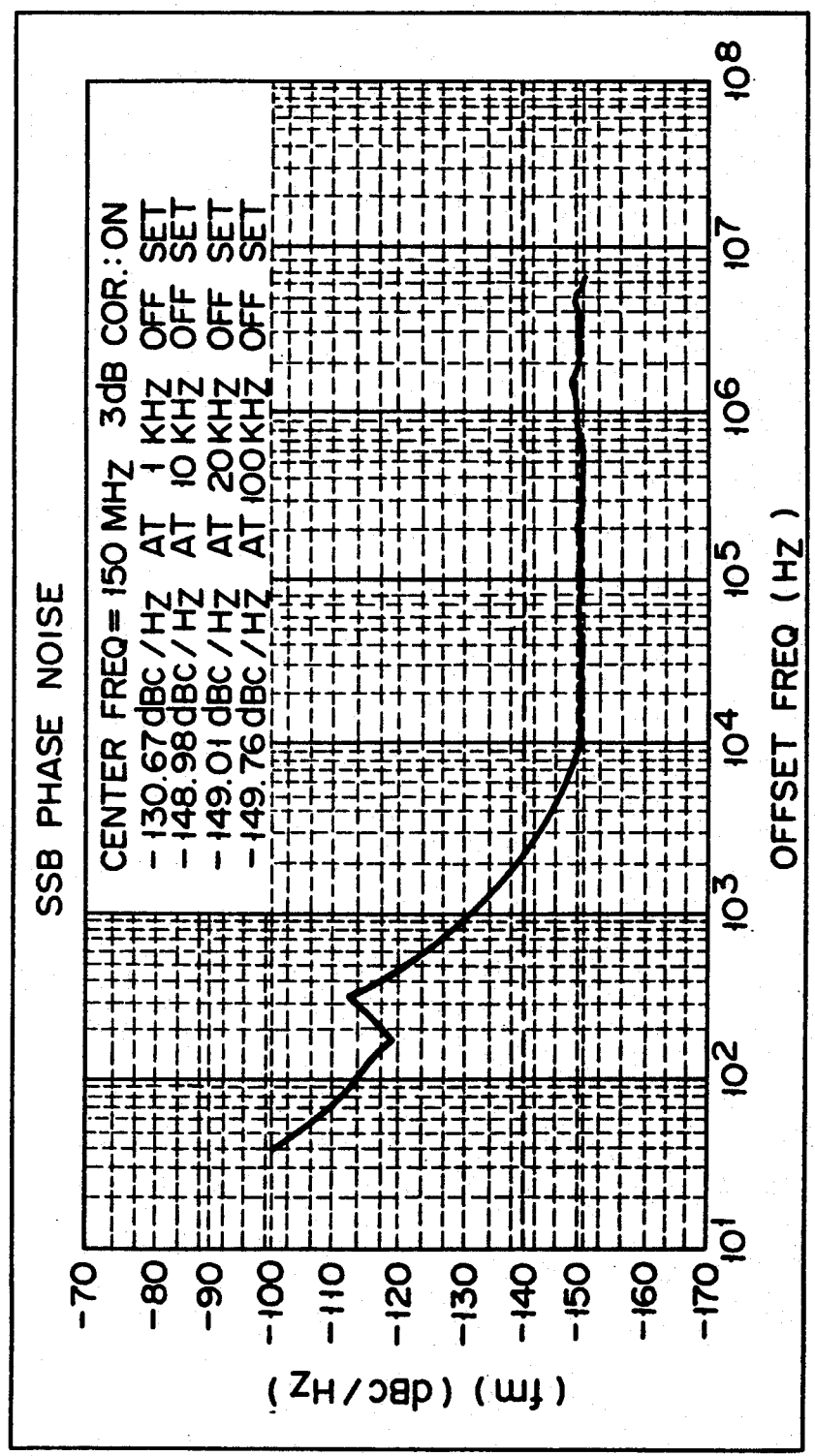
F I G. 3B

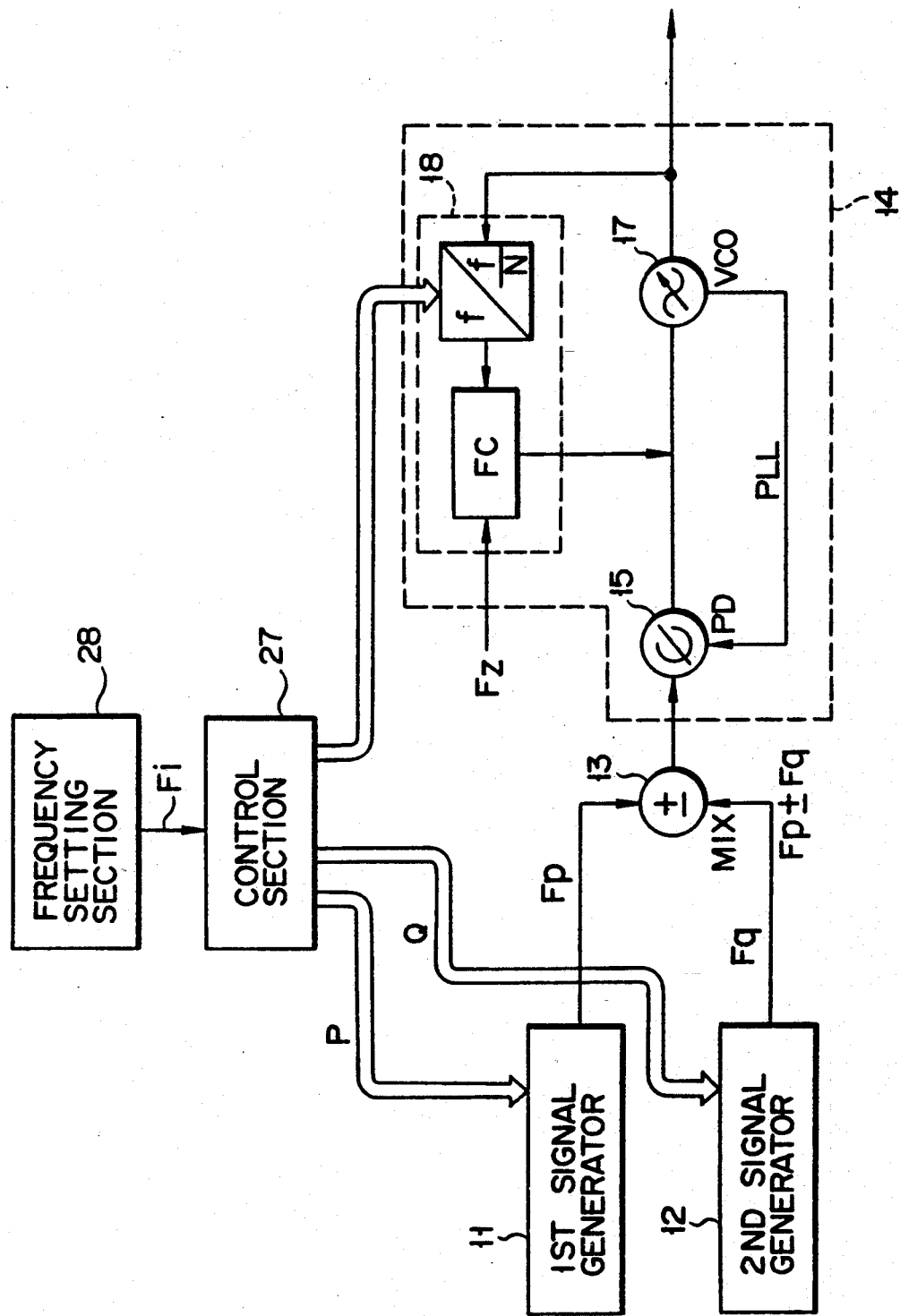
F I G. 5

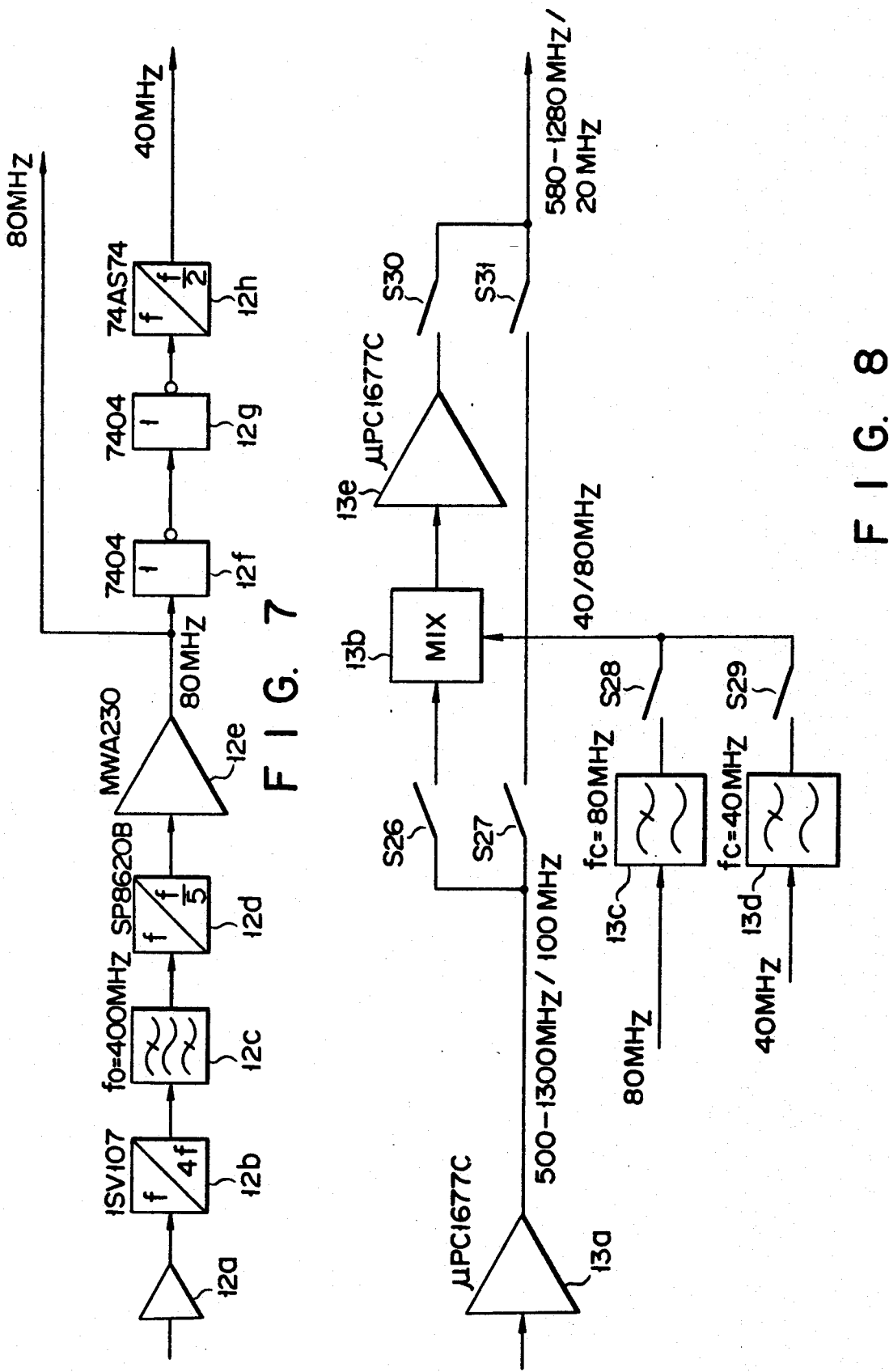

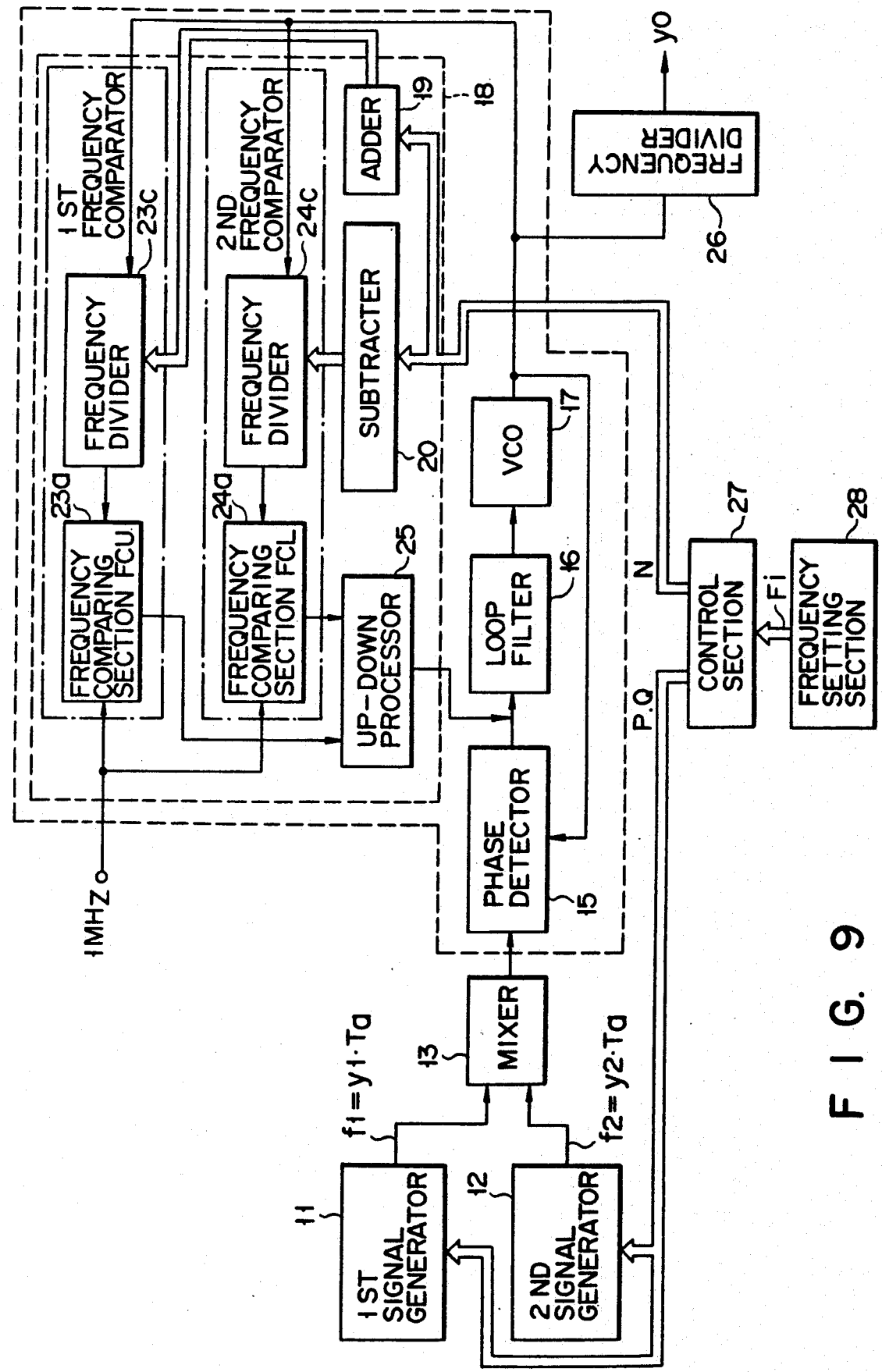
F I G. 9

| Qa | f2 | FREQUENCIES OF T=4 (MHz) |
|---|---|---|
| 0, 5 | A | 0 |
| 1, 6 | E·Ta | 160 |
| 2, 7 | C·Ta | 80 |
| 3, 8 | C·Ta | 80 |
| 4, 9 | E·Ta | 160 |

F I G. 10

| Qa | f1 |
|---|---|
| 0, 2, 4 | f1(2pa−1) |
| 1, 3, 5, 7, 9 | f1(2pa) |
| 6, 8 | f1(2pa+1) |

F I G. 11

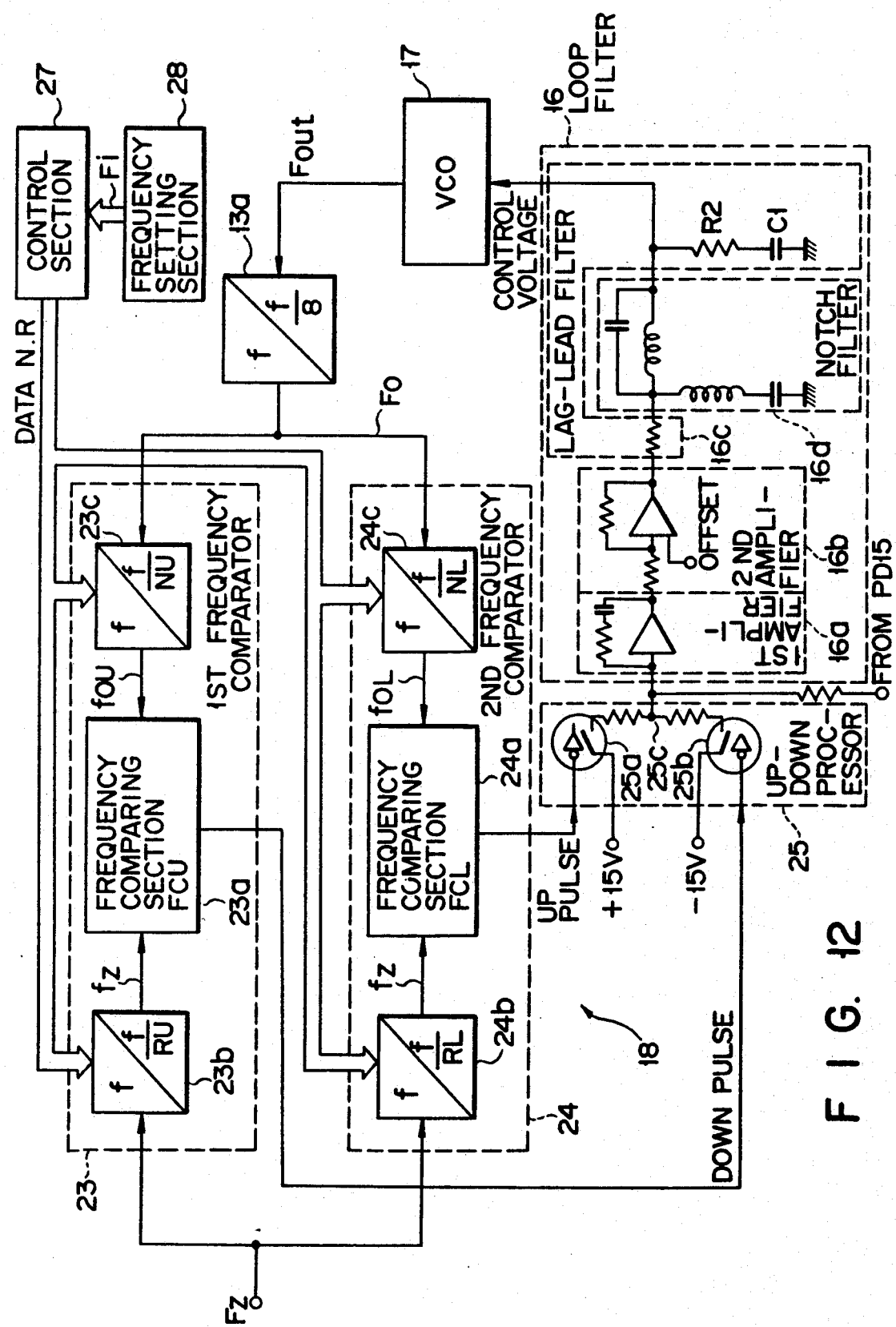
F I G. 12

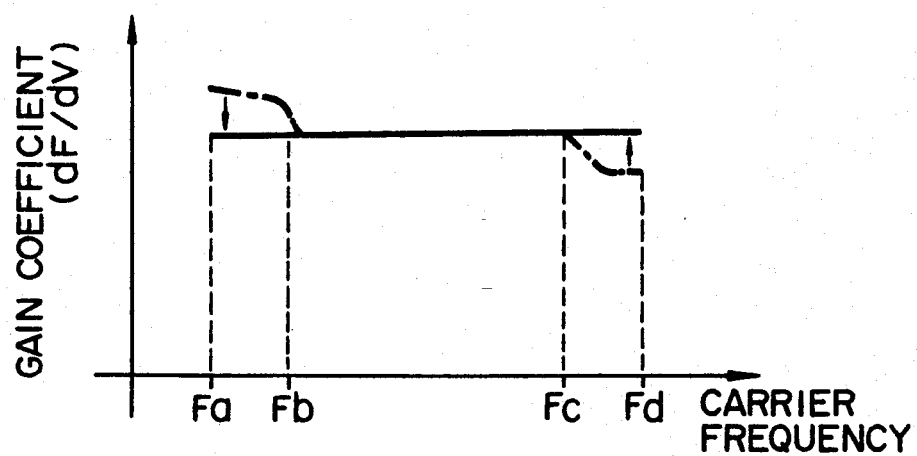
F I G. 15
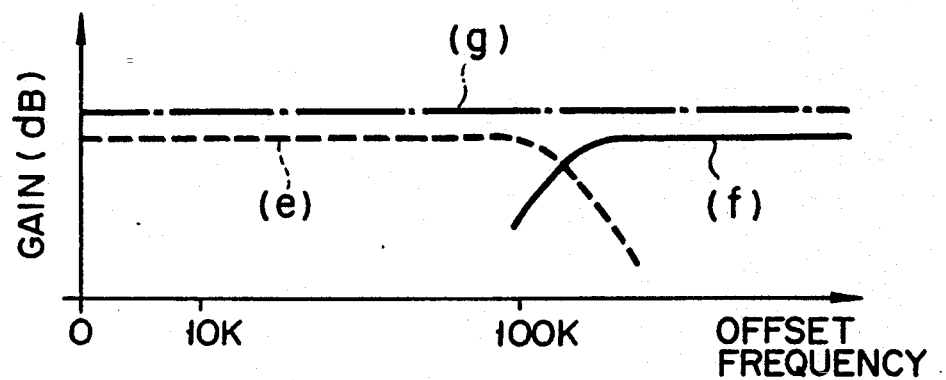
F I G. 16
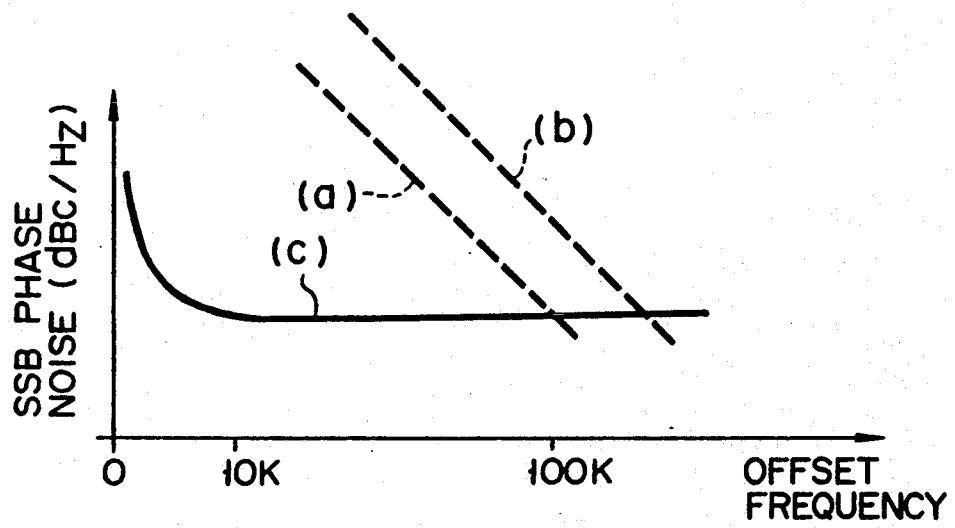
F I G. 17

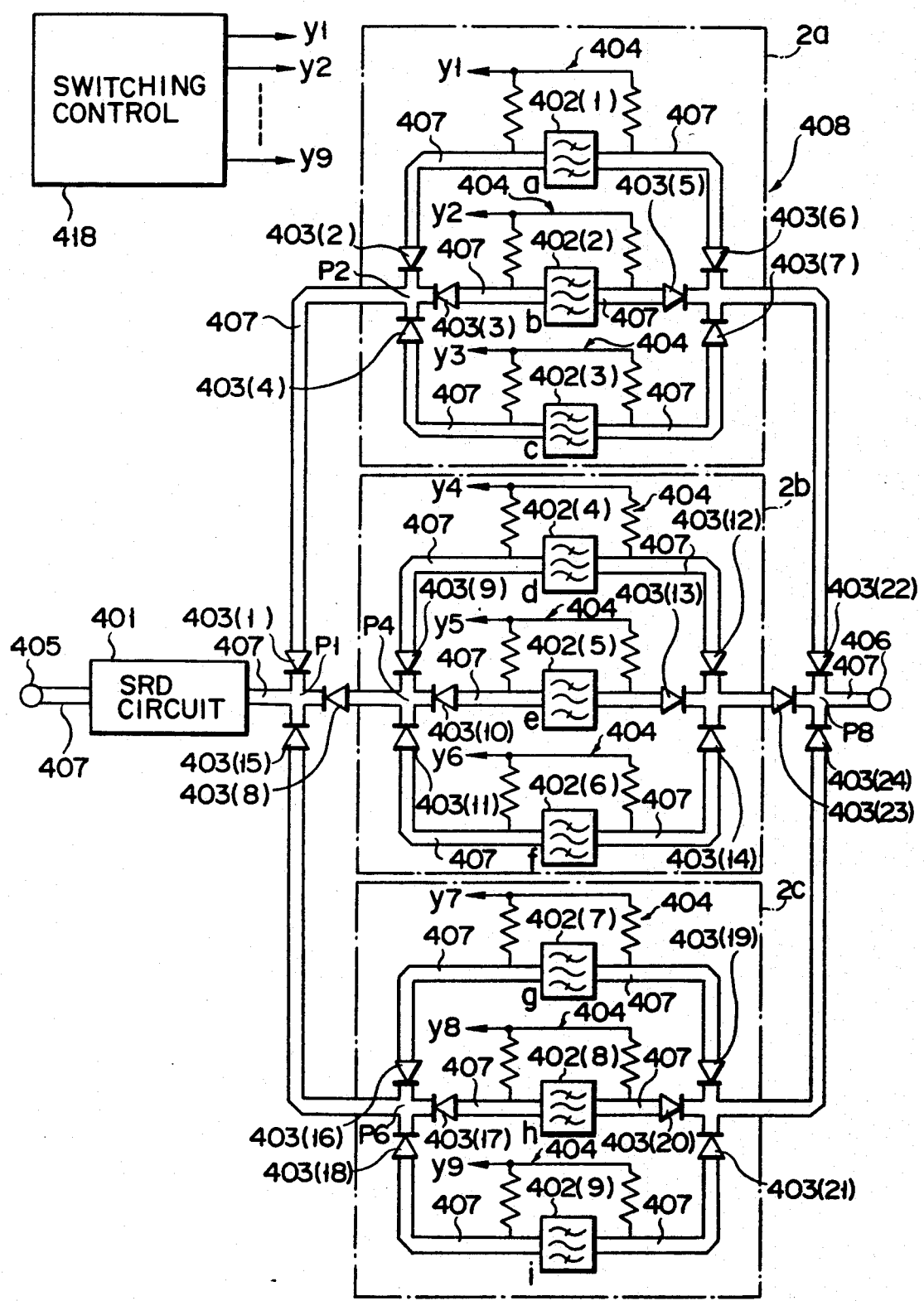
F I G. 21A

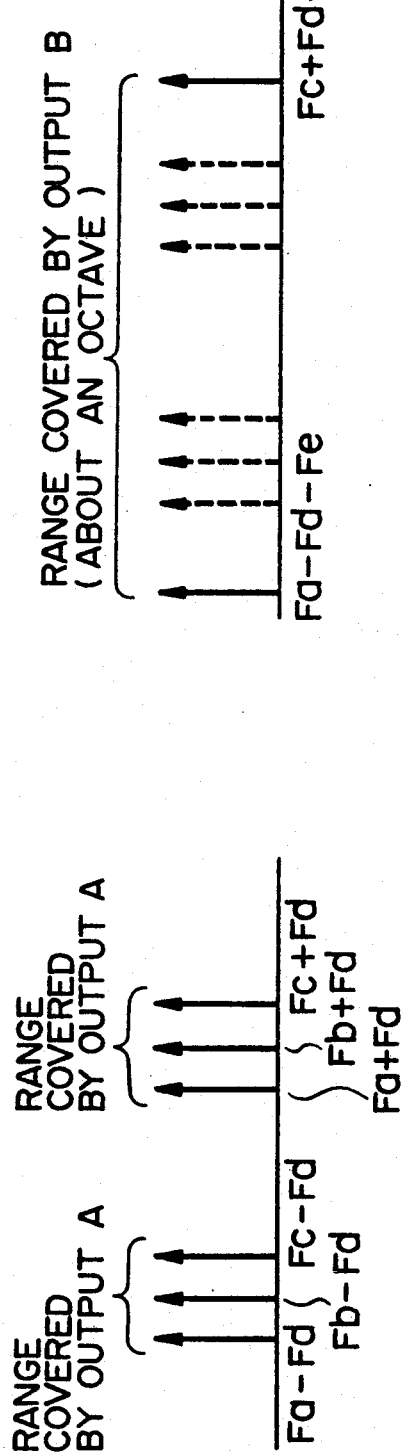
FIG. 26A (PRIOR ART)
FIG. 26B (PRIOR ART)
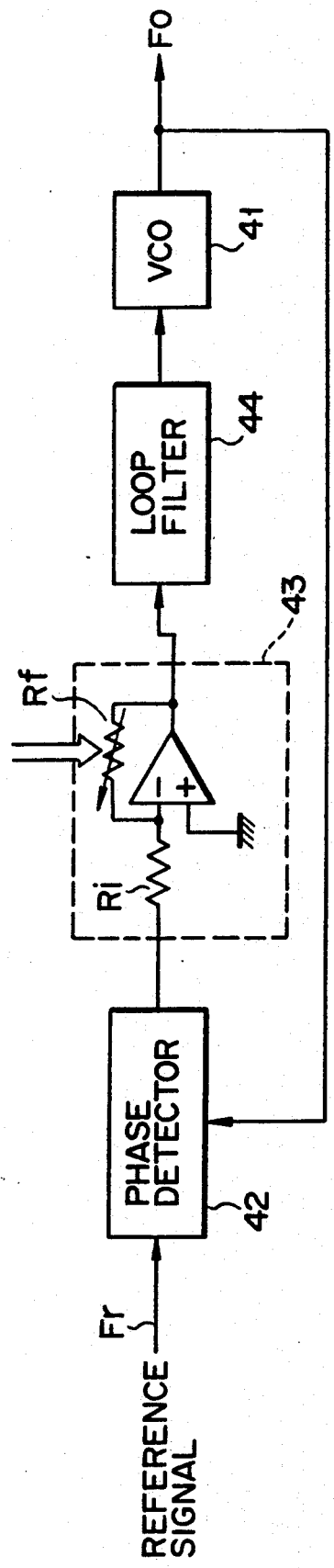
FIG. 27 (PRIOR ART)

VOLTAGE CONTROLLED OSCILLATOR WITH CONTROLLED CAPACITANCE RATIO IN POSITIVE FEEDBACK LOOP TO BROADEN BANDWIDTH

This is a division of application Ser. No. 07/570,048 filed Aug. 20, 1990.

BACKGROUND OF THE INVENTION

1. Field of the Invention

The present invention relates to circuit devices for implementing a generator of highly pure signals. More specifically, the present invention relates to a frequency synthesizer for providing highly pure signals in which noise is suppressed as low as possible and spurious components are rejected as far as possible and circuit devices, such as a voltage controlled oscillator (VCO), a phase locked loop (PLL) and a signal generator (SG), which are used in the frequency synthesizer.

2. Description of the Related Art

Recent synthesized signal generators for a quasimicrowave region of, for example, 10 KHz to 2,700 MHz are requested not only to be multifunctional but also to suppress SSB phase noise (C/N) as low as possible in order to implement a generator of highly pure signals.

To this end, a set of circuit devices, such as a frequency synthesizer, a VCO, a PLL, (a SG,) a mixer and a frequency and phase detector, which are used in a synthesized signal generator must be configured to be effective in suppressing noise individually or in combination. Moreover, the set of circuit devices must be configured to meet requirements for low noise, miniaturization and simplification.

However, conventional frequency synthesizers using a PLL and other circuit devices have not been configured yet to meet such requirements.

Hereinafter, prior arts of the circuit devices and their problems will be described.

[Prior Art 1] Frequency synthesizer

Heretofore, such a frequency synthesizer using a PLL as shown in FIG. 24 has been known.

In FIG. 24, reference numeral 1 designates a first signal generator for providing a signal fl of a frequency chosen from frequencies of, for example, 100 MHz, 200 MHz, . . . in 100 MHz step, 2 designates a second signal generator for providing a signal f2 of a frequency chosen from frequencies 10 MHz, 20 MHz, . . . 50 MHz . . . in 10 MHz step, 3 designates a mixer for combining the output signals of the first and second signal generators to produce sum and difference frequency components fl±f2, and 4 designates a well known PLL which is designed such that a mixer type of phase detector 5 detects a phase difference between an output signal of the mixer 3 and an output signal of a voltage controlled oscillator (hereinafter referred to as a VCO) 6 to provide a phase difference signal which is, in turn, applied to the VCO 6 through a loop filter 7.

In the frequency synthesizer, to provide a 110 MHz frequency component to by way of example, a 100 MHz frequency component is output from the first signal generator 1, while a 10 MHz frequency component is output from the second signal generator 2.

From the mixer 3 is output 110 MHz and 90 MHz frequency components which are sum and difference frequencies. If the free-running frequency of the VCO 6 is externally made close to 110 MHz, the PLL circuit 4 will be pulled in the sum frequency component signal from the mixer 3 so that the output of the VCO 6 is locked to the desired 110 MHz frequency signal.

With such a conventional frequency synthesizer, however, when 110 MHz is acquired as mentioned above, the beat component of 90 MHz cannot be sufficiently removed by the loop filter 7 and hence spurious components will be produced because the frequency difference between the sum and difference frequency components output from the mixer 3 is only 20 MHz. If the loop bandwidth of the PLL 4 were made narrow in order to remove the spurious components, C/N of the VCO 6 could not be improved and the response speed of the PLL 4 would be made slow.

That is, in the frequency synthesizer of FIG. 24, the first signal generator generates frequency signals $f_1$ in 100 MHz frequency steps and the second signal generator 2 generates frequency signals $f_2$ in 10 MHz frequency steps. The mixer 3 produces their sum and difference frequency components $f_1 \pm f_2$. The PLL 4 comprised of the detector 5, the VCO 6 and the loop filter 7 is synchronized with either of the sum and difference frequency components $f_1 \pm f_2$ so that desired frequencies are acquired in desired frequency steps. In this instance, 100 MHz, 110 MHz, 120 MHz, . . . are acquired. Each of the signal generators 1 and 2 is required to have as many sources of frequencies as there are frequency steps.

With such a system of prior art 1 as described above, the frequency difference between the sum and difference frequency components, i.e., $f_1 + f_2 - (f_1 - f_2) = 2f_2$, is as small as 20 MHz. When the PLL 4 is synchronized with $f_1 + f_2 = 110$ MHz, therefore, the difference frequency component of 90 MHz also enters the PLL 4 but cannot be totally removed by the loop filter 7. As a result, it remains as a spurious component. The problems encountered in narrowing the bandwidth of the loop filter are an insufficient improvement in the C/N of the VCO 6 and a slow response of the PLL 4. Another problem with the conventional frequency synthesizer is that each of the first and second signal generators 1 and 2 is required to have as many sources of frequencies as there are frequency steps.

[Prior Art 2] Frequency synthesizer

An improved frequency synthesizer, which aims at solving the problems of the prior art 1 and achieving the frequency synthesis with a smaller number of frequencies, is disclosed in Japanese Unexamined Patent Publication 61-16623 (U.S. Pat. No. 4,603,304).

This improved frequency synthesizer is schematically illustrated in FIG. 25. The frequency synthesizer comprises five sources of frequencies ($F_a$, $F_b$, $F_c$, $F_d$, $F_e$) and first and second PLLs 9 and 10 which include mixers 9a and 10a to perform frequency synthesis over a frequency range an octave wide. 9b and 10b designate phase detectors and 9c and 10c designate VCOs.

FIGS. 26A and 26B illustrate how each of the frequency sources covers the frequency range. As can be seen from FIG. 26A, six frequencies can be output at the output A of the first PLL 9 but frequencies of $F_a$, $F_b$ and $F_c$ cannot be output. Those frequencies are supplemented by the second PLL 10 as illustrated in FIG. 26B.

In this frequency synthesizer, the following drawbacks arise from the use of the PLL including the mixers 9a and 10a.

(a) The input frequencies (in this instance, $F_a$, $F_b$, $F_c$) are not utilized effectively because they cannot be taken out individually as an output of the first PLL 9. For this reason, the addition of a PLL is required. In order to take each of Fa, Fb and Fc out as an output of the first PLL 9, it is required that an input of the mixer on the side of the voltage controlled oscillator be placed at a potential of zero. If this were done, however, the PLL 9 itself could not be organized.

(b) The application of the improved system to a low frequency range will lower the reference frequency Fe of the PLL. This will result in problems of the spurious component, the C/N and the speed of response as discussed in the prior art 1.

[Prior art 3] Frequency synthesizer

Another technique is disclosed in U.S. Pat. No. 3,902,132. This technique basically uses a PLL including a mixer as with the prior art 2 and has the same problems as the prior art 2. In this case, however, the PLL used is one in number, but sources of input frequencies increase in number due to a drawback that the input frequencies cannot be used effectively as PLL outputs by the use of the PLL incorporating the mixer.

[Prior Art 4] PLL

The PLL is adapted to synchronize an oscillation signal frequency with a reference signal and finds extensive applications in frequency synthesizers, demodulators and so on. An exemplary arrangement of the PLL is illustrated in FIG. 27.

As illustrated, an output signal of a voltage controlled oscillator (VCO) 41 is applied to a phase detector 42 along with a reference signal. The phase detector 42 produces an error signal which is, in turn, amplified by a direct current amplifier 43 for application to a loop filter 44. A control voltage from the loop filter 4 always forces the frequency and phase of the VCO 41 to vary in a direction that synchronizes with the reference signal. For this reason, the VCO frequency Fo will track frequency variations of the reference signal while maintaining lock with its frequency Fr.

To vary the frequency of the VCO 41 over a wide frequency band in this type of PLL, it is required that the slope of the voltage versus free-running frequency characteristic (hereinafter referred to as the VF characteristic) of the VCO 41 itself be constant over its full frequency band.

However, the VF characteristic of VCOs usually has a tendency that the higher the frequency range, the smaller the slope becomes as illustrated in FIG. 28. Its gain coefficient varies as the frequency range varies as illustrated in FIG. 29.

When a PLL is formed with such a VF characteristic of the VCO maintained, the loop gain varies greatly with the frequency range, thereby disabling the loop response characteristic from becoming optimized.

For this reason, the gain of the direct current amplifier 43 is varied externally for each of the frequency ranges (the magnitude of a feedback resistor Rf is varied with respect to an input resistor Ri) so that the apparent gain coefficient of the VCO 41 within the loop may be constant.

However, the broadband PLL with a compensating circuit consisting of the direct current amplifier 43 suffers from a problem that high frequency SSB phase noise cannot be suppressed sufficiently.

This problem will be discussed below.

It is generally known that the SSB phase noise characteristic of a VCO extends over a predetermined range centered at a carrier frequency and there is a difference of 6 dB between the characteristic (a) when the carrier frequency is F1 and the characteristic (b) when the carrier frequency is 2F1 as shown in FIG. 30.

In controlling the VCO having such a noise characteristic with the PLL loop, a loop gain of 20 dB is required in order to obtain $-120$ dBc/Hz phase noise at the carrier frequency F1 and an offset frequency (a deviation from the carrier frequency) of, for example, 10 KHz. When this loop gain is maintained, the SSB phase noise of an output signal of the VCO is suppressed as shown by (c) in FIG. 31.

With the direct current amplifier 3, however, its cutoff frequency lowers as its gain increases as illustrated in FIG. 31. Thus, a sufficient gain cannot be obtained in a frequency range in which a high gain is needed for compensation of the gain coefficient so that a loop gain of 6 dB needed when the carrier frequency is 2F1 becomes difficult to obtain.

For this reason, the phase noise when the carrier frequency is high is not suppressed on the side of high frequencies (higher than 100 KHz in this case) in offset frequency, thereby considerably degrading the signal purity.

[Prior Art 5] VCO

The VCO used in the PLL circuit is an oscillator whose output frequency is variably controlled by an externally applied voltage and may be arranged as shown in FIG. 32.

The VCO of FIG. 32 is a Colpitts oscillator and comprised of a resonant circuit 51 connected to an input terminal via a choke coil L11 and having a coil L12 and variable capacitance diodes D11 and D12 connected between the respective terminals of the coil L12 and ground, an active circuit 52 connected to the resonant circuit 51 via a coupling capacitor C11 and oscillating mainly at a frequency corresponding to the resonant frequency of the resonant circuit 51, a buffer circuit 53 for taking out an oscillating output of the active circuit 52, and a feedback circuit 54 connected between the input and output of the active circuit 52 and having capacitors C12 and C13 for determining a quantity of feedback on the basis of their capacitance ratio. The application of a control voltage of the variable capacitance diodes D11 and D12 from the input terminal 50 controls the frequency at which the active circuit 52 oscillates. An output signal of the active circuit 52 is taken out via the buffer circuit 53.

With the oscillator described above, the capacitance ratio of the capacitors C13 and C12 of the feedback circuit 54 is fixed and the quantity of feedback is also fixed independently of frequency.

With such a prior art as described above, since the quantity of feedback between the input and output of the active circuit 52 is fixed, the frequency range of oscillation is determined only by the quantity of feedback.

The following experiments were therefore performed: the capacitance of the capacitor C13 was set larger than usual for low frequency oscillation; and the capacitance of the capacitor C13 was set smaller than usual for high-frequency oscillation. The experimental results are illustrated in FIGS. 33 through 36.

In the case of the low frequency oscillation, the linear frequency versus control voltage characteristic could be obtained up to about 1170 MHz when the control voltage was increased gradually as shown in FIG. 33. Thereafter the oscillation frequency saturated so that high frequency oscillation could not be achieved. Also, as shown in FIG. 34, the output level decreased as the oscillation frequency increased.

In the case of the high frequency oscillation abnormal oscillation occurred when the magnitude of the control voltage was small and thus the oscillation frequency was low as shown in FIG. 35. This resulted in great level variations in a low frequency range from 600 to 700 MHz as shown in FIG. 36.

There is no problem in particular when the VCO is restrictively used at either a high frequency or a low frequency. In communication equipment needing frequencies the band of which is an octave or more wide with a high speed processing and a compact size, broadband oscillation ranging from a low frequency up to a high frequency needs be performed by a single VCO. To this end, a plurality of oscillators with fixed capacitors adapted for different frequencies and a selector connected to the oscillators may be provided. In this case, the selector can select one of the oscillators to provide a desired frequency. With such an arrangement, however, the provision of the plural oscillators and the selector leads to circuit complexity and an increase in cost.

[Prior Art 6] Signal generator

As the first signal generator used in the frequency synthesizer described above is used a signal generator which selects a desired harmonic from among harmonics generated by a step recovery diode circuit (hereinafter referred to as an SRD circuit) forming a frequency multiplier. The SRD circuit is known as a circuit which generates a plurality of harmonics by multiplying a predetermined input frequency by an integer of N.

FIG. 37 illustrates an example of a conventional signal generator using such an SRD circuit.

In this case, obtained harmonic signals do not represent flat characteristics in a level-frequency curve, so that frequencies of very low levels which do not take sufficient S-N ratios are resulted.

The SRD circuit 111 is structured such that on a dielectric circuit board, not shown, are disposed an SRD circuit 111, a plurality of paralleled bandpass filters 113 connected to the SRD circuit 111 by patterns 112, and a switching circuit 115 for controlling pin diodes 114 provided on the input and output patterns 112 of each of the bandpass filters 113. When input signals of different frequencies are applied to an input terminal 116, they are multiplied by the SRD circuit 111 in frequency by N and a fixed frequency signal in the multiplied-by-N signals is allowed to pass through the bandpass filter 113 associated with paired pin diodes 114 that are rendered on by the switch circuit 115 for transmission from an output terminal 117.

With the conventional signal generator described above, however, each of the pin diodes 114 is disposed at a halfway point of its respective individual pattern 112 to which the bandpass filter 13 is connected. When a pair of pin diodes 114 are rendered on by the switch circuit 115 to form a transmission path and all other pin diodes are off, the output of the SRD circuit 111 is transmitted over the patterns 112 associated with the pin diodes rendered off up to the pin diodes on the input sides of the bandpass filters 113. This will impose unnecessary loading on microstrip-line transmission paths, interfere with the desired frequency signal output from the output terminal 117 and cause a great disturbance in the amplitude versus frequency characteristic of the output signal as shown in FIG. 38.

To obtain signals at the same level from the output terminal 117, as many SRD circuits as there are required frequencies may be provided. With such an arrangement, however, an increase of the SRD circuits in number will lead to circuit complexity, an increase in cost, an increase in the occupied area of the SRD circuits on the circuit board and reduced packaging efficiency.

SUMMARY OF THE INVENTION

In view of the prior arts 1 through 3 described above, it is a first object of the present invention to provide a frequency synthesizer which permits highly pure signals to be efficiently obtained at frequency intervals of resolution $\Delta F$ within a desired frequency band of an octave width and spurious components to be suppressed to a minimum.

In view of the prior art 4 described above, it is a second object of the present invention to provide a PLL which permits a highly pure signal to be obtained over a broadband of frequencies for adaptation to the above frequency synthesizer of the first object of the present invention.

In view of the prior art 5 described above, it is a third object of the present invention to provide a voltage controlled oscillator which permits its control voltage versus oscillation frequency characteristic to be linear over a broadband of frequencies including a low frequency and a high frequency and amplitude variations in its output to be reduced without making its circuit arrangement too complex for its adaptation to the frequency synthesizer.

In view of the prior art 6 described above, it is a fourth object of the present invention to provide a signal generator which permits the area for its installation to be set to a minimum without making its circuit arrangement complex and desired harmonics to be output without impairing characteristics of an SRD circuit for its adaptation to the above frequency synthesizer.

According to a first aspect of the present invention there is provided a frequency synthesizer comprising:

a control section; a first signal generator responsive to said control section for selectively outputting one of frequency signals whose frequencies are represented by $Fp = a \times |P| \times \Delta F$ (where a coefficient a is a positive odd number and a coefficient P is an integer); a second signal generator responsive to said control means for selectively outputting on of frequencies whose frequencies are represented by $Fq = b \times |Q| \times \Delta F$ (where a coefficient b is a positive integer exclusive of integral multiples of prime factors into which is resolved and a coefficient Q is an integer and satisfying the expression $|Q| \leq (a-1)/2$); a mixer for mixing a frequency signal Fp from said first signal generator and a frequency signal Fq from said second signal generator; and a frequency selecting circuit for selecting either of frequency signals $|Fp - Fq|$ or $Fp + Fq$ output from said mixer, said control section determining the values of P and Q satisfying the following expression (1) on the basis of a desired frequency signal $Fi = m \times \Delta F$, a coefficient $m = 0, 1, 2, \ldots n$ set in predetermined frequency steps $\Delta F$; and quotient T and remainder s of m/a to cause each of said first and second signal generators to output a predetermined frequency and said frequency selecting circuit to select one of said frequency signals |Fp−Fq| and Fp+Fq that corresponds to said frequency signal Fi, $$P = T + (s - b \times Q)/a \quad (1)$$

According to a second aspect of the present invention there is provided a PLL circuit comprising:

an oscillator responsive to a control signal to output a variable oscillator frequency;

a phase detector for making a phase comparison between an output signal of the oscillator and a reference signal;

a loop filter for extracting a direct current variable component contained in an output error signal from the phase detector and feeding said direct current variable component to said oscillator as a control signal to synchronize an output signal of the oscillator with said reference signal;

an alternate current coupling circuit for adding only an alternate current component contained in the error signal from the phase comparator to the control signal for application to said oscillator; and a compensating circuit inserted in an alternate current signal path of said alternate current coupling circuit for compensating the gain of said oscillator for the control signal apparently uniformly.

According to a third aspect of the present invention there is provided a voltage controlled oscillator comprising:

a resonant circuit comprising at least a coil and a variable capacitance diode;

an active circuit having an input connected to said resonant circuit;

a variable capacitance ratio circuit connected between input and output of said active circuit for causing the active circuit to oscillate at a resonant frequency of said resonant circuit, the variable capacitance ratio circuit comprising a variable capacitance diode and a capacitor; and means for applying a control voltage to said variable capacitance diode to vary the frequency at which the active circuit oscillates.

According to a fourth aspect of the present invention there is provided a signal generator comprising:

a harmonic generating means responsive to an input signal for generating harmonic signals;

a plurality of first diodes connected to cause the outputs of the harmonic generating means to branch;

a plurality of second diodes for causing signals from the first diodes to further branch;

bandpass filters connected to the second diodes, respectively, each of the bandpass filters selectively outputting a desired harmonic signal; and switching control means for switching the first and second diodes.

Additional objects and advantages of the present invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 and FIGS. 3A and 3B illustrate typical SSB phase noise characteristics of the synthesized signal generator of FIG. 1;

FIG. 5 is a block diagram of a frequency synthesizer according to a first embodiment of the present invention;

FIGS. 6 through 8 illustrate specific circuit arrangements of main sections of the frequency synthesizer of FIG. 5;

FIG. 9 is a block diagram of a frequency synthesizer according to a second embodiment of the present invention;

FIGS. 10 and 11 are diagrams for explaining the operation of a main section of the frequency synthesizer of FIG. 9;

FIG. 12 is a block diagram illustrating an example of the frequency detector of FIG. 9;

FIGS. 15 and 16 illustrate characteristics of main sections of FIG. 14;

FIG. 17 is a diagram illustrating the noise suppression by the PLL circuit of FIG. 14;

FIGS. 21A and 21B illustrate schematic arrangements of signal generators according to a fifth embodiment of the present invention;

FIGS. 26A and 26B are diagrams illustrating the operation of the frequency synthesizer of FIG. 25;

FIG. 27 is a block diagram of a conventional PLL circuit;

DETAILED DESCRIPTION OF THE PREFERRED EMBODIMENTS

Figure 1:
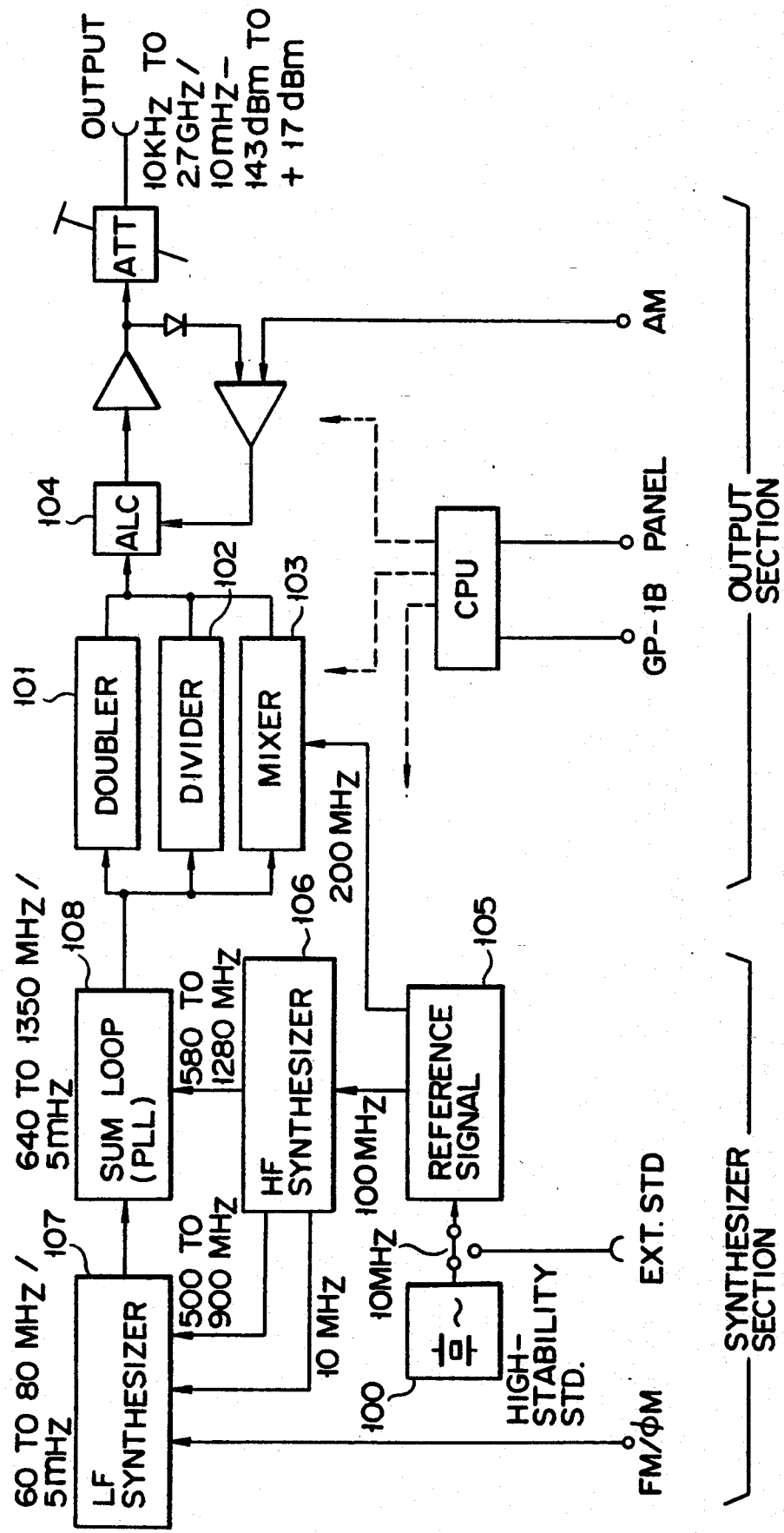
FIG. 1 is a schematic block diagram of a synthesized signal generator implemented by the use of various circuit devices of the present invention.

Reference will now be made in detail to the presently preferred embodiments of the invention as illustrated in the accompanying drawings, in which like reference characters designate like or corresponding parts throughout the several drawings.

First, a synthesized signal generator (SSG) implemented as a generator of highly pure signals by the use of a frequency synthesizer, a PLL, a VCO and an SG according to the present invention will be outlined with reference to FIG. 1.

FIG. 1 is a block diagram of a synthesized signal generator for use in a quasi-microwave frequency band from 10 KHz to 2700 MHz which can achieve the SSB phase noise characteristic of −140 dBc/Hz at 20 KHz detuning point at 1 GHz by means of multiple loops.

This SSG is basically divided into two major sections, a synthesizer section and an output section.

The synthesizer section is responsive to a 10 MHz reference signal to output an octave signal of 640–1350 MHz/5 mHz and a 200 MHz local signal for a beat band. In the output section receiving the two output signals of the synthesizer section, a frequency doubler 101, a frequency divider 102 and a mixer 103 produce a broadband signal of 10 KHz -2.7 GHz/10 mHz which is, in turn, applied to an automatic level control (ALC) circuit where it is amplitude modulated and its output level is controlled between −143 dBm and +17 dBm.

The multiple loops that the SSG uses is inherently complex but can be represented simply in functional blocks like the synthesizer section of FIG. 1. Actually the multiple loops has one loop for a reference signal generator 105, two loops for a high frequency synthesizer 106, seven loops for a low frequency synthesizer 107 and one loop for a sum loop (PLL) 108, that is, a total of eleven loops. In order to incorporate functions which are to form standards of future signal generators, such as low noise, broadband, various modulating functions, rich sweep functions, fast frequency switching and low leakage, into an ordinary size (177H ×426W ×451Dmm, 32 kg or less) with such a circuit scale, the SSG simultaneously pursues two themes: noise reduction; and high-speed operation, miniaturization and simplification.

Techniques for realizing those themes are summarized as follows.

For noise reduction, (1) A reference signal has its noise reduced at one point and is multiplied simply.

(2) A PLL has its frequency band widened and its noise reduced by means of an AC loop.

(3) An interpolation signal is synthesized at a high frequency and has its frequency divided to reduce noise.

(4) An FM VCO has its maximum deviation made large and has its frequency divided after addition.

(5) A block diagram is modified according to FM deviation.

For high speed operation, miniaturization and simplification of circuit, (1) The use of an octave VCO.

(2) Non-adjustment of LOCk by means of a frequency detector.

(3) The simplification of a control line by means of a serial data transmission line.

(4) The high speed data transfer by means of an optical link.

(5) The high speed setting by means of an LSI dedicated to frequency data calculation.

(6) The full use of surface mount components.

(7) The patterning of connections and the like.

The Noise Reduction of the Reference Signal at One Point and the Simple Frequency Multiplication thereof The SSB phase noise of an indirect-method synthesizer using a PLL is determined by the noise levels of the reference signal and VCO itself.

In the case of multiple loops configuration, the sum loop (PLL) 108, which is the last loop, simply adds a plurality of reference signals together. It is general to select the loop frequency band at a point at which the noise level of the reference signal and the noise level of the VCO itself becomes equal to each other.

In the case of that SSG, (60–80 MHz/5 mHz)+ (580–1280 MHz/20 MHz)=640–1350 MHz/5 mHz. If 1280 MHz is directly produced from a 10 MHz reference signal, then the multiplication factor will be 128 and the SSB phase noise will be increased by 42.1 dB. If −160 dBc/Hz at 10 MHz, then −117.9 dBc/Hz at 1280 MHz.

To avoid an increase of noise due to such frequency multiplication, the factor of frequency multiplication may be decreased. For example, 10 MHz is first multiplied by 10 in the reference signal generator 105 to produce 100 MHz. If there is a method of reducing noise in 100 MHz as low as in 10 MHz, multiplication by 12 is further made to provide a signal of −138.4 dBc/Hz at 1200 MHz. Subsequently, if 80 MHz can be produced at a low noise level, the noise increase problem will be solved. Considering all 20 MHz step reference signals likewise, it will be appreciated that all the reference signals can be produced simply by combining 100 MHz ×N, 80 MHz and 40 MHz.

Namely, the frequencies can be represented very simply by the following mathematical expressions.

580 MHz = 100 MHz ×5+80 MHz
600 MHz = 100 MHz ×6
620 MHz = 100 MHz ×7−80 MHz
640 MHz = 100 MHz ×6+40 MHz
660 MHz = 100 MHz ×7−40 MHz
680 MHz = 100 MHz ×6+80 MHz
1260 MHz = 100 MHz ×13−40 MHz
1280 MHz = 100 MHz ×12+80 MHz

With no frequency multiplication, 80 MHz can be produced as follows.

80 MHz = 100 MHz ×4+5

40 MHz can be produced simply by dividing 80 MHz by 2. This makes full use of the merits of noise reduction of 100 MHz at one point.

A 10 MHz signal is generally produced by a highly stable crystal oscillator OCXO and the SSB phase noise at 20 KHz detuning point is about −160 dBc/Hz. At 20 KHz detuning point of 100 MHz VCXO, the SSB phase noise as much as −160 dBc/Hz can readily be obtained.

Utilizing this property, the highly stable standard oscillator 100 divides the 100 MHz VCXO output by 10 to produce 10 MHz and the reference signal generator 105 is constituted by a multiply-by-10 PLL which is phase locked to the 10 MHz reference signal.

In addition to a crystal oscillator, a rubidium oscillator may be used as the standard oscillator. If the bandwidth of the PLL is limited to some tens of hertz, the noise characteristic of the 100 MHz reference signal is not affected by the characteristic of the standard oscillator but depends upon the bare characteristic of the 100 MHz VCXO.

Since −160 dBc/Hz at 100 MHz is still insufficient, the reference signal generator 105 further reduces its noise by use of a crystal filter. However, the crystal filter having an abrupt selective characteristic has its characteristic degraded when operating at large signal levels. When optimizing its attenuation characteristic and input levels, the 100 MHz reference signal of −160 dBc/Hz at +12 dBm input becomes a super low noise signal of +8 dBm, −174 dBc/Hz.

The multiplication of 100 MHz by N in the high-frequency synthesizer combines a step recovery diode (SRD) and a helical filter. When the SRD is used self biased, about +18 dBm is required as its drive level. Since commercial available amplifiers are lacking in power, a low noise amplifier with a gain of 12 dB gain and a noise figure (NF) of 1 dB was developed by the use of discrete components. Consequently, this amplifier serves as an important component for noise reduction.

The SRD can generate frequency components N times the input frequencies in a broadband so that it is well used as a comb generator. From the standpoint of the SSB phase noise, however, the compatibility of the broadband characteristic with the stable operation was found to be very difficult. Although, at first, one SRD was used to produce nine outputs from 500 MHz to 1300 MHz in 100 MHz steps, three SRDs each adapted to produce three outputs were used finally to produce nine low-noise harmonic signals stably.

On the other hand, the 80 MHz reference signal is produced by multiplying 100 MHz from the reference signal generator 105 by four by a dedicated SRD and then dividing resultant 400 MHz by five by an ECL divider. Also, the 40-MHz reference signal is produced by dividing the 80-MHz reference signal by two by an AS divider.

For mixing of 100 MHz ×N with 80 MHz and 40 MHz is needed an ultrahigh-level DBM which is used for measuring SSB phase noise. Since the mixed output signal contains many spurious components, the PLL 108 which selectively locks to a specified reference signal is inserted as a bandpass filter (BPF). The deterioration of the SSB phase noise due to passing through the PLL 108 can be avoided by widening the loop band of the PLL 108 to a maximum. On the other hand, the narrower the loop band of the PLL 108, the more the effect of the BPF for removing spurious components increases.

Since the lowest reference frequency is high as 40 MHz, the use of a notch filter for removing integer-multiple components of 20 MHz at the same time will permit the SSB phase noise characteristic and the spurious characteristic to be compatible with each other.

The SSB phase noise at 20 KHz detuning point is −153 to −147 dBc/Hz for N times components of 100 MHz and −150 dBc/Hz for 80 MHz and 40 MHz. The resultant SSB noise for 580–1280 MHz/20 MHz is −144 to −147 dBc/Hz and the spurious is −90 dBc or less.

Band Broadening and Noise Reduction of the PLL by means of an AC Loop

For miniaturization and simplification of the circuit, a semi-coaxial type of VCO based on a semi-rigid cable, which can cover an octave frequency band, was used as the VCO of the PLL 108.

For this reason, the SSB phase noise of the VCO itself cannot be expected to be at 1 GHz, −100 dBc/Hz with 20 KHz detuned and −140 dBc/Hz with 2 MHz detuned.

It is impossible to extend the loop band to 2 MH or above stably even if a commercially available broadband operational amplifier is used, which causes a great change in phase. When a phase change occurs, it becomes difficult to control the damping factor of the loop and the SSB phase noise deteriorates at frequencies around the frequency at which the loop gain falls to zero. To improve this, in addition to a DC loop comprised of an active filter and an adder amplifier, an AC loop for directly coupling a PD output to a passive filter by C cut is added. The DC loop serves to, with its gain fallen, generate a control voltage necessary for phase lock and improve noise at 20 KHz detuning point, while the AC loop serves to control the loop bandwidth with its gain risen sufficiently and a linearizer consisting of an analog switch matched to the linearity of the f-V characteristic of the VCO further added. The linearizer in the AC loop can be adjusted more easily than the linearizer in the DC loop.

Interpolation Signals are Synthesized at High Frequencies and Frequency divided for Noise Reduction Next, the noise reduction of the other reference signals generated by the low frequency synthesizer 107, 60–80 MHz/5 mHz, will be considered.

Those reference signals are each used to be interpolated between the reference signals in 20 KHz steps and thus serve as interpolation signals. The noise level that those signals have appear at the output of the sum loop 108 repeatedly at 20 MHz intervals. The phase noise and spurious noise can be improved by frequency division. For this reason, the reference signals were synthesized by 300–400 MHz/25 mHz and a five-fold frequency and frequency divided by 5 so that an improvement of 14 dB was obtained.

The phase noise is in the order of −150 dBc/Hz due to limitations of the divider itself. As means of raising the frequencies of the interpolation signals, addition of the reference signals is performed. The reference signals are generated by the same process as the reference signals for the final sum loop 108 described above.

FM VCO has its Maximum Deviation made large and its Output Frequency divided after addition The generation of an FM signal is a key to the signal generator. If the function of FM is unnecessary, the design of the signal generator will easily be made in a quite different manner.

The weak point of conventional synthesized signal generators is the addition of FM signals. For FM signals, there is a mode, called DC-FM, in which frequency variations can be made by a direct current component. In other words, because of the DC-FM, a part is required which is out of locked condition and not a synthesizer.

As an exception, some use an A/D converter, convert frequency modulated signals to frequency setting information, and are always in the synthesizer state. In this case, the adjustment of delay times due to the processing time of the A/D converter and phase continuous frequency switching are required. Thus, a direct digital synthesizer, a digital phase synthesizer or a fractional N system is required.

The part which is not a synthesizer, namely, which is in free-running state, cannot attain a sufficient noise level by itself unless a cavity oscillator or crystal oscillator is used therein. Also, it is difficult to obtain frequency stability which is close to that of synthesizers. The noise reduction of a broadband FM signal cannot be effected by a BPF or the like.

The frequency division allows noise to be reduced though deviation is decreased. At the same time, the frequency stability is also improved. From the above considerations, the FM VCO is designed such that its maximum deviation is made large for frequency division following addition.

Modification of the Block Diagram according to the FM Deviation

It is very difficult to satisfy low phase noise at the time of CW, and frequency stability and FM maximum deviation at the time of DC-FM at the same time.

A basic measure is only to design signal generators which are quite different from one another in their block diagrams according to the FM deviation. For this reason, three synthesizer modes of Hi-stability, Middle and Wide are actually prepared and circuits are switched according to the FM deviation.

The FM signal is generated by a VCO of 20 MHz ±2 MHz. The resultant maximum deviation is 2 MHz. The 20 MHz ±2 MHz signal is, as a reference signal of the FM sum loop, added to low-order digit signals to produce interpolation signals of 300–400 MHz/25 mHz. As the first switching, a 20 MHz ±2 MHz is frequency divided by five to prepare a reference signal of 4 MHz ±400 KHz. In this case as well, the frequency range of the low-order digit signals is changed to produce interpolation signals of 300–400 MHz/25 mHz.

As the second switching, a ¼ divider is added to a feedback loop of the FM sum loop. Then, the 20 MHz ±2 MHz FM signal becomes equivalent to the 80 MHz ±8 MHz reference signal apparently. Namely, the FM signal is frequency multiplied by four in the FM sum loop.

The three cases are summarized as follows. In the first case, the FM signal is added as it is so that the maximum deviation is kept at 2 MHz. In the second case, the 4 MHz ±400 KHz FM signal is added so that the maximum FM deviation becomes 400 KHz. The third case is equivalent to the addition of the 80 MHz ±8 MHz FM signal so that the maximum FM deviation is 8 MHz. The first, second and third cases correspond to the Middle, Hi-stability and Wide modes, respectively.

As described above, the interpolation signal is frequency divided by five before it is entered into the last sum loop. At the 640 MHz –1350 MHz/5 mHz output of the synthesizer section, the FM maximum deviation is 80 KHz in the Hi-stability mode, 400 KHz in the Middle mode and 1.6 MHz in the Wide mode.

The frequency stability in the Hi-stability mode is 10 Hz/H and the SSB phase noise at 20 KHz detuning point, −140 dBc/Hz, is also satisfactory.

Next, techniques for speeding up, miniaturization and simplification of circuits which support noise reduction will be described.

Non-adjustment of LOCK by means of a Frequency Detector

The frequency detector allows five high frequency small PLLs to be mounted on a printed circuit board along with the octave VCO described above. In a conventional technique, pulling of the frequency of a VCO is performed for a narrow frequency range (one of any divided ranges) which is obtained by dividing a whole frequency range with a dividing of VCOs, for example, L or VCO changing and voltage presetting. It is, however, difficult to obtain an octave frequency range.

Hence, it is assumed that a D/A converter should be used. Even if the output of the D/A converter is linearly proportional to set frequency information and the V-f characteristic of the VCO is linear, the PLL lock may not be performed when the VCO linearity does not fall within an error of several percent in view of temperature characteristics. If a ROM is used to generate a preset voltage which is optimum for each frequency, the VCO linearity need not be considered. But, the acquisition of data to be written into the ROM and the temperature characteristics of the VCO and the like remain as problems. In place of the D/A converter, the frequency detector was used so as to make fast 3 ms LOCK possible on a non-adjustment basis. The frequency detector serves as a type of window detector.

The window detector is comprised of a detector for detecting an upper limit value and a detector for detecting a lower limit value. Each of the detectors outputs a pulse when its input value exceeds a limit value. The upper limit detecting detector outputs down pulses for downward correction, while the lower limit detecting detector outputs up pulses for upward correction.

When an input value falls within a window between the upper and lower limit values, the detectors produce no pulse and enters the stable state. In practice, a commercially available frequency detector which operates on a one-to-one frequency basis can be used to compose an N-to-one detector. This is implemented by placing a 1/N divider at the preceding stage of one input of the frequency detector.

When the VCO output is connected to an input of the 1/N divider and a 1 MHz reference signal is connected to the other input, the detector can detect (N)MHz. If two sets of these circuits are combined with one divider as 1/(N+2) divider and the other divider as 1/(N-1) divider, a window detector of (N+2) MHz −(N-1) MHz is formed.

The up pulses and down pulses are added to the PD outputs in the active filter of the PLL.

Simplification of a Control Line based on a Serial Data Transfer Line

To perform setting of data in the 1/N divider necessary for the frequency detector and controlling of analog switches about 800 wires are required. For this reason, the serial data transfer line is completely used.

High Speed Data Transfer based on an Optical Link

Data was transferred between the synthesizer and the CPU over an optical link so as to overcome transfer speed and noise problems.

High Speed setting based on an LSI dedicated to Frequency Data Calculation

The high speed performance of the optical link was fully utilized by an LSI dedicated to BCD calculation, $2^N$ calculation and serial transfer.

Total Adoption of Surface Mount Components

Surface mount components were totally adopted as a trump card for miniaturization.

Patterning of Wires

In order to stabilize performance, most of the wires including shield lines were patterned.

A synthesized signal generator as a highly pure signal source which permits noise reduction at the highest level could be implemented using the techniques described above.

Figure 2:
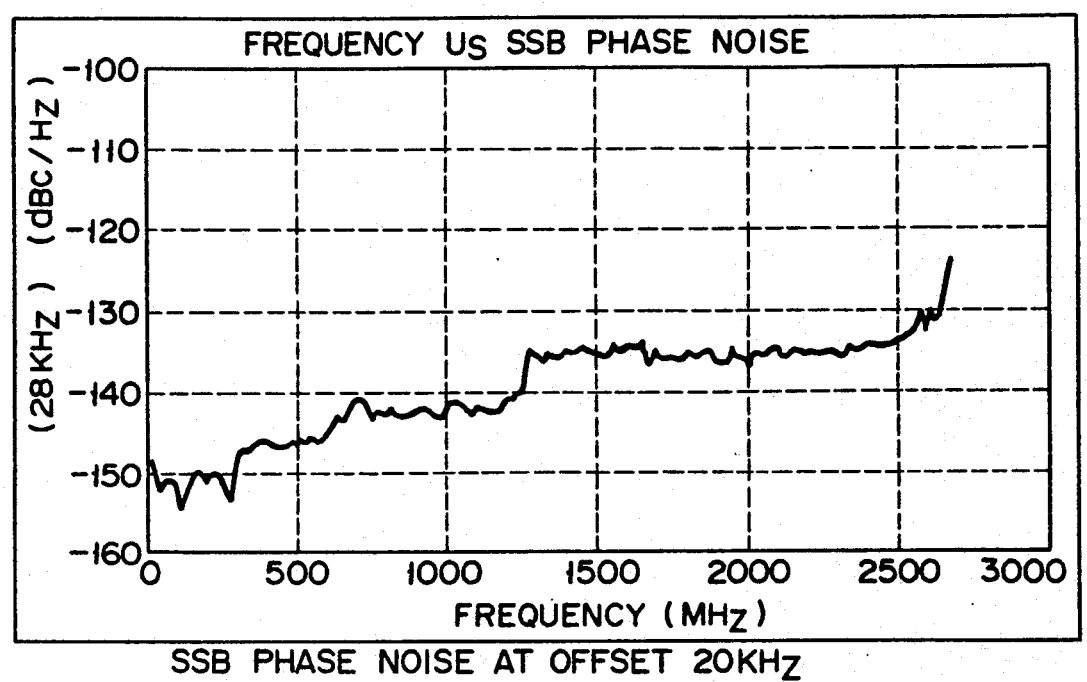

FIG. 2 and FIGS. 3A and 3B illustrate typical phase noise characteristics of the SSG at offsets of 20 KHz, at 1 GHZ and at 150 MHz, respectively.

The background of the reduction of SSB phase noise in particular will be described herein.

In a conventional frequency synthesizer, since the synthesizer of reference frequencies at low frequencies is carried out using an RF band design, second signal generator output 10 MHz steps are added to or subtracted from first signal generator output 100 MHz steps to synthesize 290-640 MHz. The synthesized frequencies are added to other reference signals by a SUM loop and multiplied by two to obtain desired frequencies 640-1350 MHz.

In this technique, since the synthesis is performed within half of a desired frequency range, the SSB phase noise should be improved by 6 dB over a desired value. However, only signals of the order of $-147$ dBc/hz can be synthesized due to noise deterioration resulting from device floor noise and the addition and subtraction for 10 MHz steps.

Figure 4:
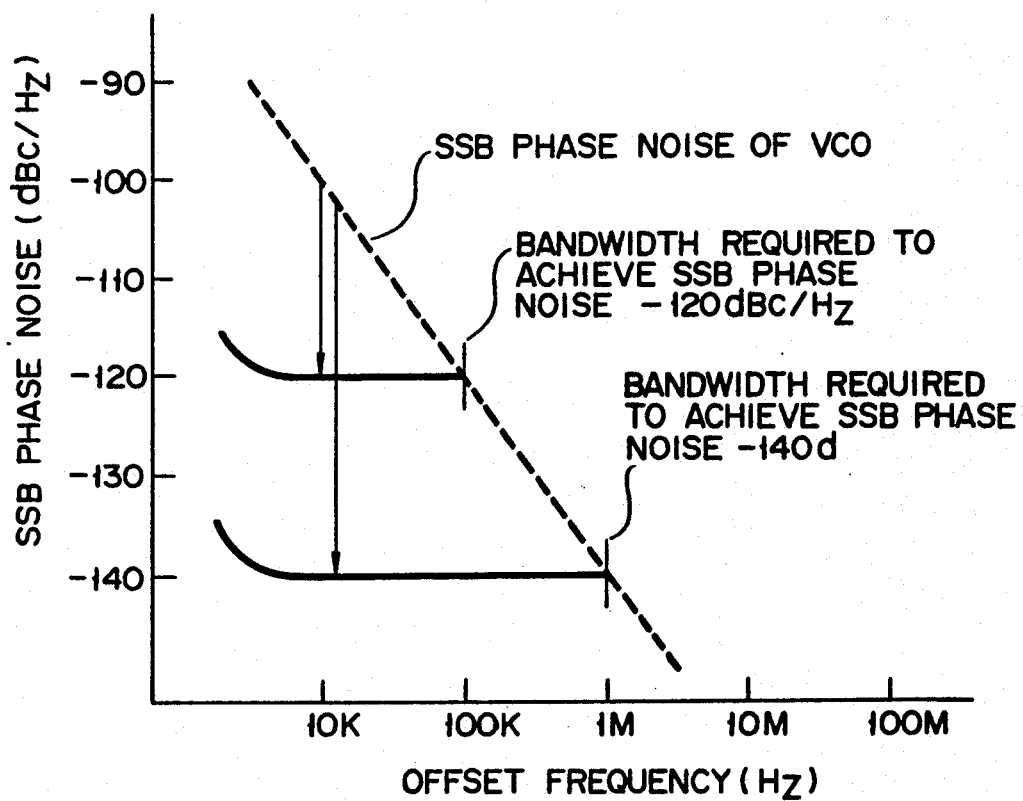
FIG. 4 is a diagram illustrating the background of reduction of the SSB phase noise.

By the way, the cutoff of a loop band depends on how much noise level is to be reduced. To reduce VCO noise up to $-140$ dBc/Hz as in FIG. 4, the cutoff has to be extended up to a far point. With the conventional technique, however, since there is the lowest frequency 10 MHz at the second signal generator output, broadening of the loop band to 10 MHz or more is impossible in view of spurious components.

How far the band is to be broadened depends greatly on the SSB phase noise of the VCO itself which is limited by an output range of oscillation frequencies. That is, the narrower the output range, the more the noise characteristic is improved. Thus, the PLL bandwidth may be narrow. In the present invention, the VCO output range needs an octave or more and the loop band has to be widened because the SSB phase noise of the VCO itself cannot be expected.

To cover an octave or more band in the conventional technique, use is made of two or more VCOs which are switched by means of a switch. In the present invention, however, the band must be covered by one VCO to avoid switch circuit complexity, SSB phase noise deterioration and space problems.

Next, some embodiments of circuit devices used in such a synthesized signal generator serving as a source of highly pure signals will be described.

[First Embodiment] Frequency Synthesizer

The frequency synthesizer according to the first embodiment is used as the HF synthesizer 106 of FIG. 1 and its basic arrangement is illustrated in FIG. 5.

That is, the frequency synthesizer of FIG. 5 includes a first signal generator 11 for providing outputs from 500 to 1300 MHz in 100 MHz steps, a second signal generator 12 for producing a resolution of $\Delta F$ by addition to and subtraction from the outputs of the first signal generator 11, a mixer 13, provided outside of a PLL 14, for additively and subtractively combining the outputs of the first and the second signal generator or directly transmitting the output of each of the signal generators, a control section 27 for determining which of the resultant outputs is to be selected according to a setting in a frequency setting section 28 and performing calculations, and the PLL 14 having a frequency detector (FD) 18 responsive to output data from the control section for directly counting outputs of a VCO 17 in the PLL 14 to set upper and lower limit thresholds digitally, and converging frequencies in its window. The PLL 14 performs filtering and outputs a desired output frequency. The PLL 14 aims to remove spurious components but need not be limited to this. The VCO 17 used in the PLL 14 covers an octave band by itself. Thus, a plurality of VCOs need not be switched. Reference numeral 15 designates a phase detector in the PLL 14.

In FIG. 5, the frequencies Fp and Fq of the first and second signal generators 11 and 12 are controlled by the control section 27 on the basis of desired frequency information Fi set in the frequency setting section 28 by an operator. From the mixer 13 are output frequency signals of $|Fp-Fq|$ and $Fp+Fq$. The PLL 14 locks to one of the output frequency signals and removes the other frequency component.

Hereinafter, description is made specifically.

First, the output frequencies Fp and Fq of the first and second signal generators 11 and 12 are related as follows.

Note here that there is the condition that the desired frequency information Fi is set in predetermined frequency steps $\Delta F$ such that $Fi = m \times \Delta F$. (m: positive integer, $\Delta F$: positive real number)

$$Fp = a \times P \times \Delta F$$

where a is a positive odd number and P is an integer.

$$Fq = b \times Q \times \Delta F$$

where b is a positive integer excluding integral multiples of prime factors into which a is resolved and Q is an integer satisfying $|Q| \leq (a-1)/2$.

$$P = T + (s - b \times Q)/a$$

where T and s are quotient and remainder when m (=Fi/ΔF) is divided by a, respectively, and they are each a positive integer inclusive 0.

Of the coefficients, a and b are fixed values which are determined when the frequency synthesizer is designed.

The coefficients P and Q have their ranges of values determined at the time of design. Their values to be taken during operation are determined in accordance with desired frequency information Fi set actually.

Subsequently, the theory of a basic example will be outlined.

$$Fi/\Delta F = a \times T + s = (Fp + Fq)/\Delta F = a \times P + b \times Q$$

In this expression, P and Q each take a positive value or a negative value.

Assuming herein that P=T+t (t is an integer), $$a \times T + S = a \times (T+t) + b \times Q$$

$$S = a \times t + b \times Q$$

then Q and P are represented by
$$Q = (s - a \times t)/b$$

$$P = T + (s - b \times Q)/a$$

The above relationship allows tables 1, 2, 3, 4, 5 and 6 to be made up with a, s and b used as parameters. These tables are uniquely determined because the integer t satisfying $|Q| \leq (a-1)/2$ is only one in number.

The tables 1 and 2 are used to obtain Q and t when a=5. In the tables 3 and 4, s, Q and P are turbulated from a, s, b, Q, T and t and the above relationship.

Likewise the tables 5 and 6 are used to obtain Q and t when a=11. If necessary, a table of s, Q and P may be made up.

Therefore, s and T are obtained from frequency information Fi, ΔF, a and b and then P and Q are determined. The values of P and Q allow the frequencies Fp and Fq output from the first and second signal generators 11 and 12 to be determined uniquely.

TABLE 1 a = 5, Q

| S | b = 1 | b = 2 | b = 3 | b = 4 | b = 5 | b = 6 |
|---|---|---|---|---|---|---|
| 0 | 0 | 0 | 0 | 0 | — | 0 |
| 1 | 1 | −2 | 2 | −1 | — | 1 |
| 2 | 2 | 1 | −1 | −2 | — | 2 |
| 3 | −2 | −1 | 1 | 2 | — | −2 |
| 4 | −1 | 2 | −2 | 1 | — | −1 |

TABLE 2 a = 5, t

| S | b = 1 | b = 2 | b = 3 | b = 4 | b = 5 | b = 6 |
|---|---|---|---|---|---|---|
| 0 | 0 | 0 | 0 | 0 | — | 0 |
| 1 | 0 | 1 | −1 | 1 | — | −1 |
| 2 | 0 | 0 | 1 | 2 | — | −2 |
| 3 | 1 | 1 | 0 | −1 | — | 3 |
| 4 | 1 | 0 | 2 | 0 | — | 2 |

TABLE 3 a = 5, b = 2

| S | Q | P |
|---|---|---|
| 0 | 0 | T |
| 1 | −2 | T + 1 |
| 2 | 1 | T |
| 3 | −1 | T + 1 |
| 4 | 2 | T |

TABLE 4 a = 5, b = 4

| S | Q | P |
|---|---|---|
| 0 | 0 | T |
| 1 | −1 | T + 1 |
| 2 | −2 | T + 2 |
| 3 | 2 | T − 1 |
| 4 | 1 | T |

TABLE 5 a = 11, Q

| S | b=1 | b=2 | b=3 | b=4 | b=5 | b=6 | b=7 | b=8 | b=9 | b=10 | b=11 | b=12 |
|---|---|---|---|---|---|---|---|---|---|---|---|---|
| 0 | 0 | 0 | 0 | 0 | 0 | 0 | 0 | 0 | 0 | 0 | — | 0 |
| 1 | 1 | −5 | 4 | 3 | −2 | 2 | −3 | −4 | 5 | −1 | — | 1 |
| 2 | 2 | 1 | −3 | −5 | −4 | 4 | 5 | 3 | −1 | −2 | — | 2 |
| 3 | 3 | −4 | 1 | −2 | 5 | −5 | 2 | −1 | 4 | −3 | — | 3 |
| 4 | 4 | 2 | 5 | 1 | 3 | −3 | −1 | −5 | −2 | −4 | — | 4 |
| 5 | 5 | −3 | −2 | 4 | 1 | −1 | −4 | 2 | 3 | −5 | — | 5 |
| 6 | −5 | 3 | 2 | −4 | −1 | 1 | 4 | −2 | −3 | 5 | — | −5 |
| 7 | −4 | −2 | −5 | −1 | −3 | 3 | 1 | 5 | 2 | 4 | — | −4 |
| 8 | −3 | 4 | −1 | 2 | −5 | 5 | −2 | 1 | −4 | 3 | — | −3 |
| 9 | −2 | −1 | 3 | 5 | 4 | −4 | −5 | −3 | 1 | 2 | — | −2 |
| 10 | −1 | 5 | −4 | −3 | 2 | −2 | 3 | 4 | −5 | 1 | — | −1 |

TABLE 6 a = 11, t

| S | b=1 | b=2 | b=3 | b=4 | b=5 | b=6 | b=7 | b=8 | b=9 | b=10 | b=11 | b=12 |
|---|---|---|---|---|---|---|---|---|---|---|---|---|
| 0 | 0 | 0 | 0 | 0 | 0 | 0 | 0 | 0 | 0 | 0 | — | 0 |
| 1 | 0 | 1 | −1 | −1 | 1 | −1 | 2 | 3 | −4 | 1 | — | −1 |
| 2 | 0 | 0 | 1 | 2 | 2 | −2 | −3 | −2 | 1 | 2 | — | −2 |
| 3 | 0 | 1 | 0 | 1 | −2 | 3 | −1 | 1 | −3 | 3 | — | −3 |
| 4 | 0 | 0 | −1 | 0 | −1 | 2 | 1 | 4 | 2 | 4 | — | −4 |
| 5 | 0 | 1 | 1 | −1 | 0 | 1 | 3 | −1 | −2 | 5 | — | −5 |
| 6 | 1 | 0 | 0 | 2 | 1 | 0 | −2 | 2 | 3 | −4 | — | 6 |

TABLE 6-continued

| | a = 11 | | | | | | | | | | | |
|---|---|---|---|---|---|---|---|---|---|---|---|---|
| | t | | | | | | | | | | | |
| S | b = 1 | b = 2 | b = 3 | b = 4 | b = 5 | b = 6 | b = 7 | b = 8 | b = 9 | b = 10 | b = 11 | b = 12 |
| 7 | 1 | 1 | 2 | 1 | 2 | −1 | 0 | −3 | −1 | −3 | — | 5 |
| 8 | 1 | 0 | 1 | 0 | 3 | −2 | 2 | 0 | 4 | −2 | — | 4 |
| 9 | 1 | 1 | 0 | −1 | −1 | 3 | 4 | 3 | 0 | −1 | — | 3 |
| 10 | 1 | 0 | 2 | 2 | 0 | 2 | −1 | −2 | 5 | 0 | — | 2 |

On the other hand, as above described, Fp and Fq each take a positive value or a negative value based on the signs of the coefficients P and Q.

Foregoing expression $Fi = m \times \Delta F = Fp + Fq$ takes a positive real number since coefficient m takes a positive integer and $\Delta F$ takes a positive real number. It is represented that the expression for Fi takes one of following expressions (1), or (2).

$$|Fp| + |Fq| \quad (1)$$

$$||Fp| - |Fq|| \quad (2)$$

then generalized conditions provide following expressions.

$$Fp = a \times |P| \times \Delta F,$$

$$Fq = b \times |Q| \times \Delta F$$

In the expressions, since coefficients a, b and Fi each take a positive value, we substantially obtain following expressions.

$$Fp = |Fp|,$$

$$Fq = |Fq|$$

Therefore, obtained frequency becomes $|Fp| + |Fq|$ or $|Fp| - |Fq|$ when these frequency signals pass the mixer 13. Actually, output of the mixer 13 becomes $|Fp| + |Fq|$ or $||Fp| - |Fq||$ since the mixer 13 does not output a negative frequency. These outputs are the same as above described expressions (1) and (2).

One of these frequency signals $|Fp| + |Fq|$ and $||Fp| - |Fq||$ is the same as the setting frequency data Fi, then the PLL circuit 14 outputs so selected signal.

Therefore, P and Q may be processed as positive value to ignore signs of P and Q which each take a negative value as listed in Tables 1 to 6.

A concrete example will be described below.

This example corresponds to the case where a = 5 and b = 2 in the previous basic example. Namely, this example corresponds to the case of table 1.

This case has the following effects.

(1) As can be seen from tables 1 and 2, when b is increased with a fixed at 5, the required frequency Fp increases.

That is, this example would be prepared as following frequencies.

In table 3, $$Fp = 5 \times \Delta F, 5 \times (T+1) \times \Delta F$$

$$Fq = 0, 2 \times \Delta F, 4 \times \Delta F$$

In table 4, $$Fp = 5 \times (T-1) \times \Delta F, 5 \times \Delta F,$$
$$5 \times (T+1) \times \Delta F,$$
$$5 \times (T+2) \times \Delta F,$$

$$Fq = 0, 4 \times \Delta F, 8 \times \Delta F$$

Likewise, even if a is changed with b fixed at 2, the frequency Fq increases in number.

Thus, an optimum number of frequencies are obtained.

(2) When b = 2, the Fq frequencies are in the multiplied relationship and can easily be produced by the use of a single signal source and frequency dividers. Since a mixer need not be used, frequencies with good C/N can be produced.

(3) The frequencies synthesized by the mixer are $Fp - 2 \times \Delta F$ and $Fp + 2 \times \Delta F$, the difference therebetween being $4 \times \Delta F$. In separating those frequencies by the PLL circuit, the bandwidth of the loop filter can be made wide.

In this example, the frequencies Fp and Fq output from the first and second signal generators 11 and 12 are determined, on condition that output signals Y0 of the PLL circuit 14 are produced in frequency steps $\Delta F$, as follows.

$$Fp = P \times 5 \times \Delta F$$

where the coefficient P takes any one of integers from 0 to n.

$$Fq = Q \times 2 \times \Delta F$$

where the coefficient Q takes any one of integers from 0 to 2.

In this way, the first and second signal generators 11 and 12 are each arranged to output one frequency signal according to a corresponding one of P and Q from the control section 27.

The control section 27 finds the quotient T and the remainder s when the frequency information Fi set by the frequency setting section 28 by $5 \times \Delta F$ and then determines the values of P and Q from table 1 corresponding to the remainder s to thereby control the first and second signal generators 11 and 12.

Examples of numeric values will be indicated below.

With outputs from 100 to 200 MHz produced in $\Delta F = 20$ MHz steps, when Fi = 100, since s = 0 and T = 1 are obtained from Fi/(5 × $\Delta F$), we have P = 1 and Q = 0. Therefore, Fp = 100 MHz and Fq = 0.

With Fi = 120, since s = 1 and T = 1, P = 2 and Q = 2. Therefore, Fp = 200 MHz and Fq = 80 MHz.

With Fi = 140, since s = 2 and T = 1, P = 1 and Q = 1. Therefore, Fp = 100 MHz and Fq = 40 MHz.

With Fi = 160, since s = 3 and T = 1, P = 2 and Q = 1. Therefore, Fp = 200 MHz and Fq = 40 MHz.

With Fi = 180, since s = 4 and T = 1, P = 1 and Q = 2.

Therefore, Fp=100 MHz and Fq=80 MHz.

With Fi=200, since s=0 and T=2, P=2 and Q=0. Therefore, Fp=200 MHz and Fq=0.

Those values are given in table 7.

TABLE 7

| | (units: MHz) | |
|---|---|---|
| $F_i$ | $F_p$ | $F_Q$ |
| 100 | 100 | 0 |
| 120 | 200 | 80 |
| 140 | 100 | 40 |
| 160 | 200 | 40 |
| 180 | 100 | 80 |
| 200 | 200 | 0 |

Assuming that the frequencies Fp and FQ are Fp=g and Fq=k, the first and second signal generators 11 and 12 respectively provide predetermined frequencies Fp=g and Fq=k to the mixer 13.

The PLL circuit 14 selectively locks to either of the output frequencies (Fp=g)−(Fq=k) and (Fp=g)+(Fq=k) of the mixer 13 according to the frequency information Fi.

Though the actual input frequency components to the mixer 13 include Fp=g, Fq=k, (Fp=g)−(Fq=k) and (Fp=g) +(Fq=k), the desired frequencies are (Fp=g)−(Fq=k) and (Fp=g)+(Fq=k).

The frequency detector 18 instructs the PLL circuit 14 to lock to either (Fp=g)−(Fq=k) or (Fp=g)+(Fq=k), and will later be described in detail (refer to FIG. 12).

Figure 6:
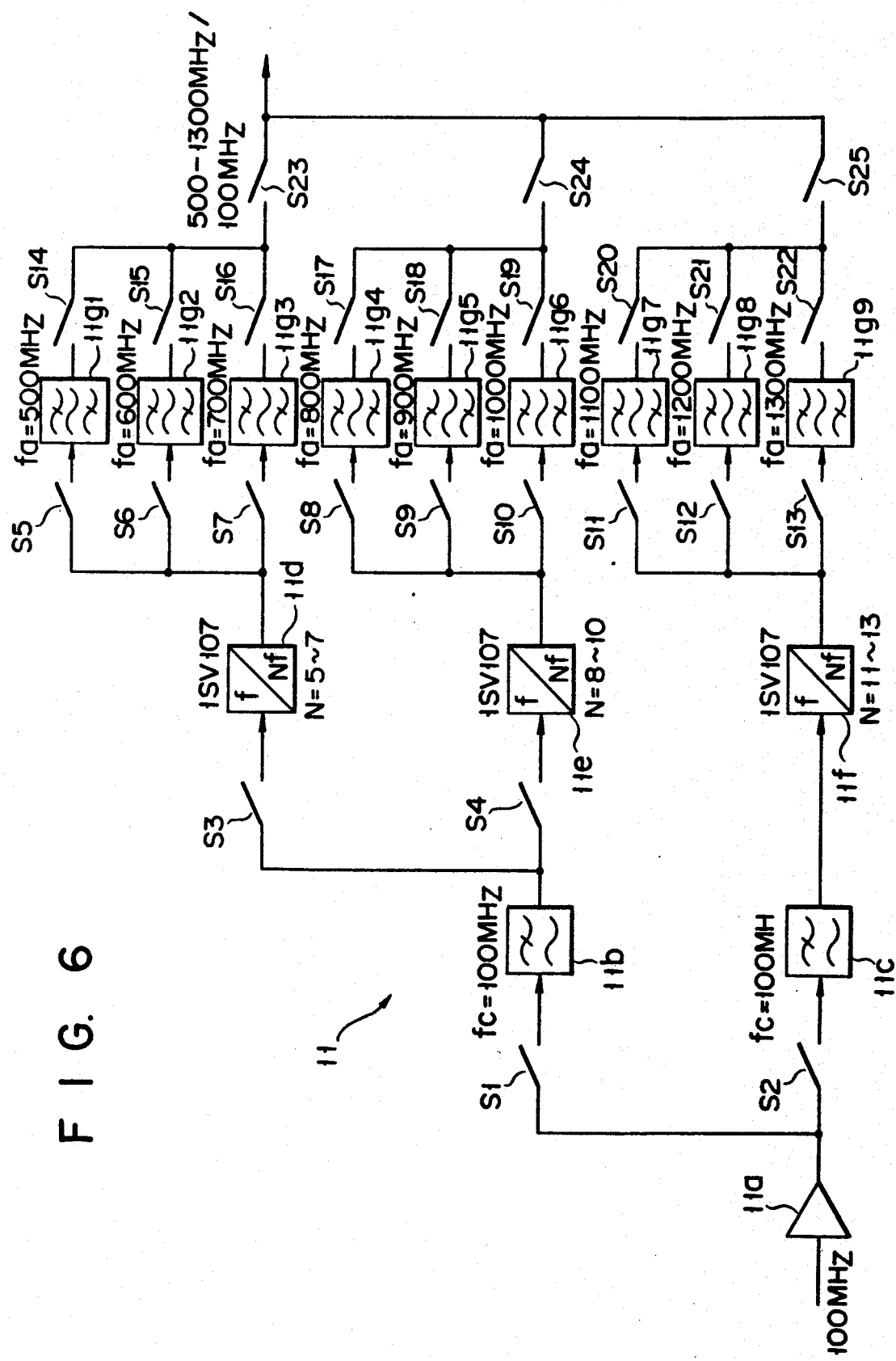

FIGS. 6, 7 and 8 illustrate specific arrangements of the first signal generator 11, the second signal generator 12 and the mixer 13 of FIG. 5, respectively. They are arranged as described in connection with the high frequency synthesizer 106.

That is, in order to output signals from 500 to 1300 MHz in 100 MHz steps by multiplying the 100 MHz signal from the reference signal generator 105 (refer to FIG. 1) by a factor of N (5 to 13), the first signal generator 11 of FIG. 6 has an input amplifier 11a, two filters 11b and 11c, three SRDs 11d, 11e and 11f operating at N=5 to 7, N=8 to 10 and N=11 to 13, respectively, and nine bandpass filters 11g1 to 11g9 three of which correspond to a respective one of the SRDs. The center frequencies of the nine bandpass filters 11g1 to 11g9 are chosen to be 500, 600, 700, 800, 900, 1000, 1100, 1200 and 1300 MHz, respectively. Switches S1 to S25 are switched by control signals from the control section 27 according to the frequency setting in the frequency setting section 28.

The second signal generator of FIG. 7 outputs a 80 MHz signal through an amplifier 12a supplied with the 100 MHz signal as described above, a multiply-by-4 SRD 12b, a bandpass filter centered at 400 MHz, a divide-by-5 frequency divider 12d and an amplifier 12e and further outputs a 40 MHz signal from a divide-by-2 frequency divider 12h via coupling devices 12f and 12g.

The mixer 13 of FIG. 8 conducts the 500 to 1300 MHz/100 MHz signals from the first signal generator 11 of FIG. 6 to an input of a mixer 12b via an amplifier 13a and the 80 MHz and 40 MHz signals from the second signal generator 12 of FIG. 7 to the other input of the mixer 12b via high pass filters 12c and 23d, respectively, so that 580–1280 MHz/20 MHz signals are output from the mixer 13b via an amplifier 12e. Switches S26 to S31 are switched by control signals from the control section 27 according to the frequency setting in the frequency setting section 28 (see FIG. 5), but they can be switched in a through manner so that, in the absence of one of the input signals to the mixer 12b, the other of the input signals may be output as it is. Whereby, the mixer 13 can directly transmit an output signal from each of the first and second signal generators in addition to the mixed outputs of the first and second signal generators in sum and difference frequencies.

Therefore, such a frequency synthesizer according to the first embodiment has the following advantages.

(a) A difference between the sum and difference frequencies from the mixer can be made large. Thus, even if the bandwidth of the loop filter of the PLL circuit is widened, broadband and high C/N signals can be output without lessening the spurious suppression effect.

(b) Signals can be output in predetermined frequency steps with a small number of signal sources.

(c) A frequency of 0 can be set to an input signal to the mixer. In this case, the frequency of the other input signal to the mixer can be output as it is, thus improving efficiency.

(d) The circuit arrangement can be made simple as compared with the prior art. This will correspondingly prevent the generation of spurious components.

[Second embodiment] Frequency synthesizer

FIG. 9 illustrates a frequency synthesizer according to a second embodiment of the present invention which is arranged to output signals in 10 MHz steps by dividing a signal having a frequency of Ta times a desired frequency by a factor of Ta.

In FIG. 9, a first signal generator 11 outputs a signal $f_1 = y_1 \times Ta$ and a second signal generator 12 outputs a signal $f_2 = y_2 \times Ta$. Furthermore, $f_1$ and $f_2$ for Ta=2 in the second embodiment correspond to Fp and Fq for a=5, b=2 in the first embodiment, respectively. The second signal generator 12 uses signals of 0 MHz, 10 MHz, 20 MHz, 30 MHz, 40 MHz and 50 MHz as reference signals which are respectively designated by A, B, C, D, E and F and outputs a signal $f_2 = y_2 \times Ta$ ($= A \times Ta$, $C \times Ta$ or $E \times Ta$) obtained by multiplying one of the reference signals A, C and E by Ta. The choice of one of the reference signals is made by a control section 27 to be described later.

Assuming the lowest frequency fl(1) of the first signal generator 11 to be 100Ta, its output frequencies are output in steps the size of which corresponds to Ta times the highest frequency F as follows.

$$f1(2) = f1(1) + F \times Ta$$
$$= (100 + F)Ta$$
$$f1(3) = f1(2) + F \times Ta$$
$$= (100 + 2F)Ta$$
$$\cdots \cdots \cdots$$
$$f1(n) = f1(n - 1) + F \times Ta$$
$$= (100 + (N - 1)F)Ta$$
$$= y1(n) \times Ta$$

where yl(n)=100+ (n−1) F. Which of the frequencies is to be output is determined by the control section 27.

Reference numeral 13 designates a mixer which mixes input signals from the first and second signal generators 11 and 12 to produce the sum and difference frequencies of the input signals.

Reference numeral 14 designates a PLL which is comprised of a phase detector 15, a loop filter 16 and a VCO 17. For high C/N and fast response, the loop filter 16 has a bandwidth of, for example, about 20 MHz.

Reference numeral 18 designates a frequency detector (hereinafter referred to as an FD) which forces the free-running frequency of the VCO 17 to be close to frequency data N (Ta times the desired frequency).

Reference numeral 19 designates an adder which adds 1 to the frequency data N, while 20 designates a subtracter which subtracts 1 from the frequency data N. The adder 19 and the subtracter 20 may be built into in the control section 27. Reference numeral 23c designates a frequency divider which divides the output frequency of the VCO 17 by a factor of (N+1), while 24c designates a frequency divider which divides the VCO output frequency by a factor of (N−1).

Reference numeral 23c designates a frequency comparing section (FCU) which produces down pulses when the output frequency of the frequency divider 23c is higher than the reference frequency (1 MHz), while 24 designates a frequency comparing section ($FC_L$) which produces up pulses when the output frequency of the frequency divider 24c is lower than the reference frequency.

The frequency comparing sections 23a and 24b may be used for the same construction.

Reference numeral 25 designates an up-down processing section which vary its output voltage in the direction to reduce the VCO frequency when receiving the down pulses or in the direction to raise the VCO frequency when receiving the up pulses. Thus, the FD is responsive to application of the frequency data N thereto to force the free-running frequency of the VCO 17 to enter a range of N+1 MHz.

Reference numeral 26 designates a frequency divider for the VCO frequency by Ta.

Reference numeral 27 designates a control section responsive to desired frequency data set in a frequency setting section 28 to determine output frequencies of the first and second signal generators 11 and 12 and frequency data N for the FD 18.

With the desired frequency data y0 set as y0=-Pa×100+Qa×10 MHz, the control section 27 causes the second signal generator 12 to output an output frequency f2 (=y2×Ta) depending on Qa as shown in FIG. 7 and causes the first signal generator 11 to output an output frequency f1 (=y1×Ta) depending on Pa and Qa as shown in FIG. 11 when the lowest output frequency is assumed to be 100 MHz. Also, the control section 27 outputs to the FD 18 the frequency data N which is Ta times the set frequency data (Pa×100+Qa×10).

Next, a description is made of the operation of the frequency synthesizer when Ta=4.

As an example, when "110" is set by the frequency setting section 28, Pa=Qa=1. The control circuit 27 therefore causes the first signal generator 11 to output a signal of f1(2)=f1(1)+F×Ta=y1(2)×Ta=600 MHz in accordance with FIG. 11 and the above expression for f1, causes the second signal generator 12 to output a signal of y2×Ta=E×Ta=160 MHz in accordance with FIG. 10, and outputs frequency data of "440" to the FD 18.

For this reason, the mixer 13 produces the sum and difference frequency components of (y1±y2) T, i.e., the sum frequency component of 760 MHz and the difference frequency component of 440 MHz. Responsive to the frequency data "440" the FD 18 forces the free-running frequency of the VCO 17 to come between 439 and 441 MHz.

The free-running frequency of the VCO 17 falls in the pull-in range of the PLL which uses the difference frequency signal of 440 MHz from the mixer 13 as the reference signal and is locked to (y1−y2) T, i.e., 440 MHz by the loop pull-in control. As a result, a desired signal of 110 MHz (y0) is output from the frequency divider 26.

The sum frequency component (y1+y2) T of 760 MHz from the mixer 13 produces a beat not of 320 MHz (y2×Ta) when mixed with the sum frequency component of 760 MHz from the mixer 13. Because the bandwidth of the loop filter 16 is sufficiently low as compared with the beat frequency, the beat note can be removed completely so that it is not transmitted to the VCO 17.

Also, since the reference signal component (440 MHz) and its harmonic components which are slightly contained in the signal of the second signal generator 12 are sufficiently far from the band of the loop filter 16 so that the VCO 17 is not modulated by the signal components and highly pure signals results.

Similarly, when frequency data of "120" is set, f1(1)=400 MHz and C×Ta=80 MHz are output from the first and second signal generators 11 and 12, respectively, so that the sum and difference frequencies of 480 MHz and 320 MHz are output from the mixer 13.

Since frequency data "480" is input to the FD 18, the output frequency of the VCO 17 is driven to the vicinity of 480 MHz and then locks to the sum frequency of 480 MHz from the mixer 13. 480 MHz from the PLL 14 is divided by 4 by the frequency divider 26 so that 120 MHz is output.

The signal of the desired frequency resulting from this frequency division is improved in C/N more than the signal output from the PLL 14.

It will be appreciated that, with this embodiment, the frequency y0(n) of the signal output from the frequency divider 26 is given by the following expressions and any one of frequencies variable in 10 MHz steps can be output.

$$y0(0) = (f1(1) + A)/Ta$$
$$y0(1) = (f1(2) - E \times Ta)/Ta$$
$$= 100 + 10$$
$$y0(2) = (f1(1) + C \times Ta)/Ta$$
$$= 100 + 20$$
$$y0(3) = (f1(2) - C \times Ta)/Ta$$
$$= 100 + 30$$
$$y0(4) = (f1(1) + E \times Ta)/Ta$$
$$= 100 + 40$$
$$y0(5) = (f1(2) + A)/Ta$$
$$= 100 + 50$$
$$y0(6) = (f1(3) - E \times Ta)/Ta$$
$$= 100 + 60$$
$$y0(7) = (f1(2) + C \times Ta)/Ta$$
$$= 100 + 70$$
$$y0(8) = (f1(3) - C \times Ta)/Ta$$
$$= 100 + 80$$
$$y0(9) = (f1(2) + E \times Ta)/Ta$$
$$= 100 + 90$$
$$y0(10) = (f1(3) + A)/Ta$$
$$= 200 + 0$$
$$y0(11) = (f1(4) - E \times Ta)/Ta$$
$$= 200 + 10$$
$$y0(12) = (f1(3) + C \times Ta)/Ta$$
$$= 200 + 20$$

It is determined by the frequency data N entered into the FD 18 whether to take the sum of or the difference between the output frequency of the first signal generator 11 and the output frequency of the second signal generator 12 in the above expressions.

The above embodiment was described with respect to the case where the second signal generator 12 outputs three kinds of output frequency y2×Ta (A, C×Ta, E×Ta). Alternatively, 100 MHz step signals from the first signal generator may be multiplied by 4 to produce 400 MHz step signals as in 400, 800, 1200 MHz, and reference signals from 0 to 50 MHz may be multiplied by 4 by the second signal generator.

In the above embodiment, a signal of a frequency of four times (Ta=4) the desired frequency is output from the PLL circuit 14. However, Ta may be any number if it is larger than 1.

In the above embodiment, the free-running frequency of the VCO 17 is forced to come close to a frequency of Ta times the desired frequency by the FD 18. Where the control voltage versus output frequency characteristic of the VCO 17 is known previously, such a control voltage as makes the free-running frequency of the VCO 17 Ta times the desired frequency may be applied from the control circuit 27 to the VCO so as to drive the free-running frequency in the pull-in range of the loop.

As described in detail, the frequency synthesizer according to the second embodiment of the present invention applies to the mixer two frequencies resulting from Ta multiplication of two frequencies the sum or difference of which exhibits a desired output frequency so as to output a signal of a frequency locked to Ta times the desired frequency from the PLL and divides the output frequency of the PLL to obtain the desired frequency. Therefore, a frequency difference between the sum and difference frequencies from the mixer can be made large, and, even if the bandwidth of the loop filter of the PLL is widened, broadband and high C/N signals can be output without lessening the spurious signal suppression effect.

Also, since the output frequency of the PLL is divided, signals which are further improved in C/N can be provided.

Furthermore, since the FD 18 is provided, the pulling performance to the locked frequency of the PLL is improved with an insulation of lock and a high speed processing.

FIG. 12 shows a block diagram of the frequency detector circuit (FD) 18.

In FIG. 12, a first and second frequency comparators 23, 24 are comprised first and second dividers 23b, 24b and 23c, 24c both sides of frequency comparing sections 23a and 24a, respectively. These, first and second divider 23b, 24b and 23c, 24c, divide the reference signal frequency and Of corresponding to the VCO output frequency Fout supplied from the VCO 17 through a $\frac{1}{8}$ divider 17a according to the data N and R from the control section 27.

Furthermore, the $\frac{1}{8}$ divider need not always be provided, if the first and second frequency comparators 23 and 24 can be used for frequency comparators which directly operate with the VCO output frequency Fout.

The first frequency dividers 23b and 24b are adapted to produce divided output frequency fZ which allows comparison in the frequency comparing sections 23a and 24b and thus their dividing factors Ru and RL are fixed.

The dividing factors Nu and NL of the second frequency dividers 23c and 24c assume values according to the setting in the frequency setting section 28.

That is, the FD 18 has upper and lower limit threshold values determined by the Nu and NL for the reference signal frequency fZ, in this case, (upper limit)=8-×$N_U$×fZ, (lower limit)=8×$N_L$×fZ. When the VCO output frequency Fout is out of the threshold values, up pulses or down pulses are generated from the frequency comparing sections 24a or 23a to thereby pull Fout in the threshold values.

The up pulses and down pulses from the frequency comparing sections 24a and 23a are applied to switches 25a and 25b of the up/down processing section 25. The switches 25a and 25b are turned on and off every time a pulse is applied thereto. During the on period, a voltage of +15 V or −15 V is applied to a coupling point 25c. The +15 V voltage is applied, via a first amplifier 16a for addition and integration of FD pulse and PD beat and a second amplifier 16b for offset shift to an output range of 0 to 32 V and inverting amplification, to the control input of the VCO 17 superimposed on the output of the loop filter 16. In this embodiment, the loop filter 16 comprises a first and second amplifiers 16a and 16b, a lag-lead filter 16c and a notch filter 16d. The first amplifier 16a is an active filter and determines a response characteristic of the loop filter 16 together with the lag-lead filter 16c. The second amplifier 16b is provided so as to input an output from the phase detector 15 with a predetermined phase to the VCO 17, is not always needed. The notch filter 16c is provided so as to remove a fixed frequency component output from the phase detector 15. Therefore, a necessary minimum construction element of the loop filter 16 is the first amplifier 16a such as the active filter having integration operation.

Thereby, the output frequency Fout of the VCO 17 is controlled to increase by the up pulses and to decrease by the down pulses.

Assuming the dividing factor for the set frequency Fo to be Nc, the following relation holds.

$$Fo/Nc = fZ$$

Namely, Fo=Nc×fZ.

This means that, with Nc given as data corresponding to the set frequency Fo, the VCO output frequency Fout is identical to the set frequency Fo.

The function of the FD 18 is to pull the VCO output frequency Fout in the vicinity of the set frequency Fo.

For example, it is assumed that the upper threshold value FoutU is 1001 MHz when Fout=1000 MHz is the set frequency.

With Fz=10 MHz and $R_U$=80, fZ=125 KHz. Since Fo=Fout/8, $f_{OU}$=FoutU/8=1001×$10^6$/8=125.125×$10^6$. Hence, $N_U$=$f_{OU}$/fZ=125.125×$10^6$/(125×$10^3$)=1001. This Nu is supplied from the control section 27.

Since fZ = $f_{OU}/N_U$ = $f_{OU}$=125×$10^6$.

(1) when $f_{OU}$>125 KHz, the down pulses are output in order to lower the VCO output frequency, (2) when $f_{OU}$≦125 KHz, no pulse is output.

Figure 13A:
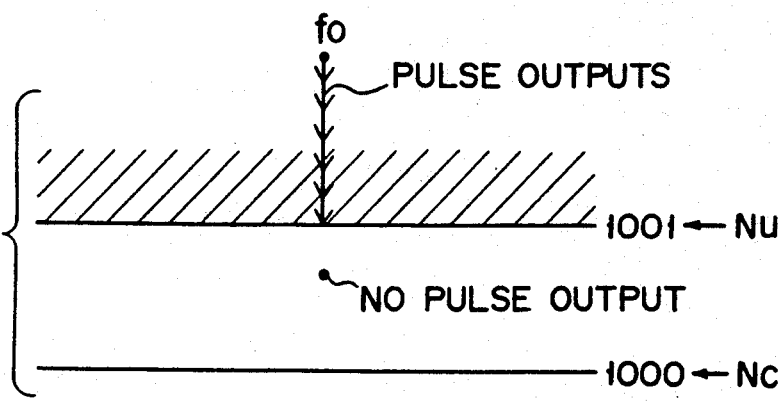
FIGS. 13A, 13B and 13C are diagrams for explaining the operation of a main section of FIG. 12.

Such downward control is illustrated in FIG. 13A.

Assuming the lower threshold value FoutL to be 999 MHz, $$FoL = FoutL/8 = 124.875 \times 10^6$$

$$N_L = f_{OL}/fZ = 999$$

This $N_L$ is supplied from the control section 27.

(1) When $f_{OL} < 125$ KHz, the up pulses are output in order to raise the VCO output frequency.

(2) When $f_{OL} \geq 125$ KHz, any pulse is not output.

Figure 13B:
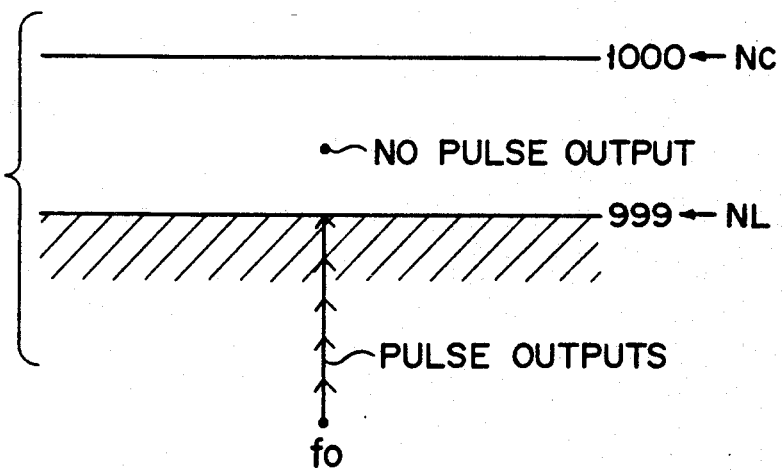

Such upward control is illustrated in FIG. 13B.

Figure 13C:
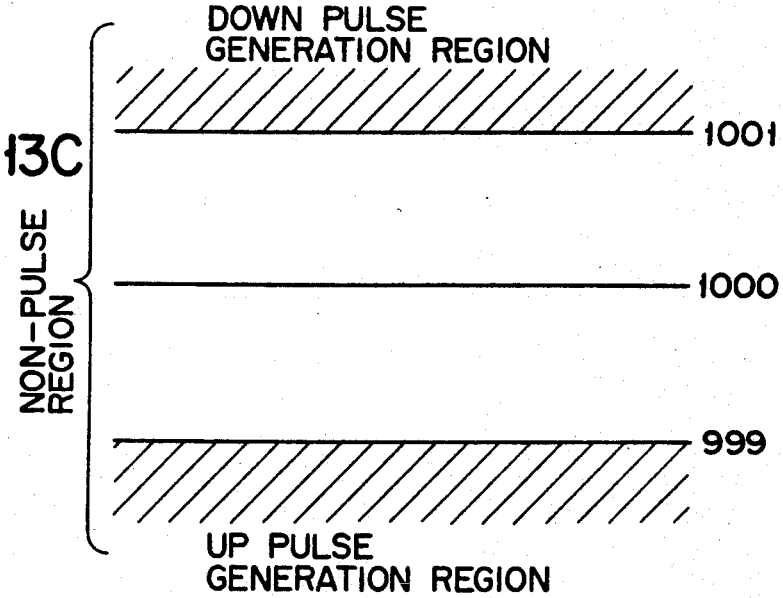

FIG. 13A and FIG. 13B are illustrated combined in FIG. 13C.

Such frequency control can be made preferable to conventional frequency control by voltage in stabilization against variations in environmental conditions including temperature.

The VCO output which has been pulled in between the threshold values in that manner will become pulled into the band of the PLL 14. Thereafter, the phase locked control will be performed on the basis of the output of comparison with the reference signal Fr = 1000 MHz in the phase detector (PD) 15.

[Third embodiment] PLL

A PLL which may be used as the PLL 14 of FIG. 5 will be described as a third embodiment of the present invention with reference to the drawings.

Figure 14:
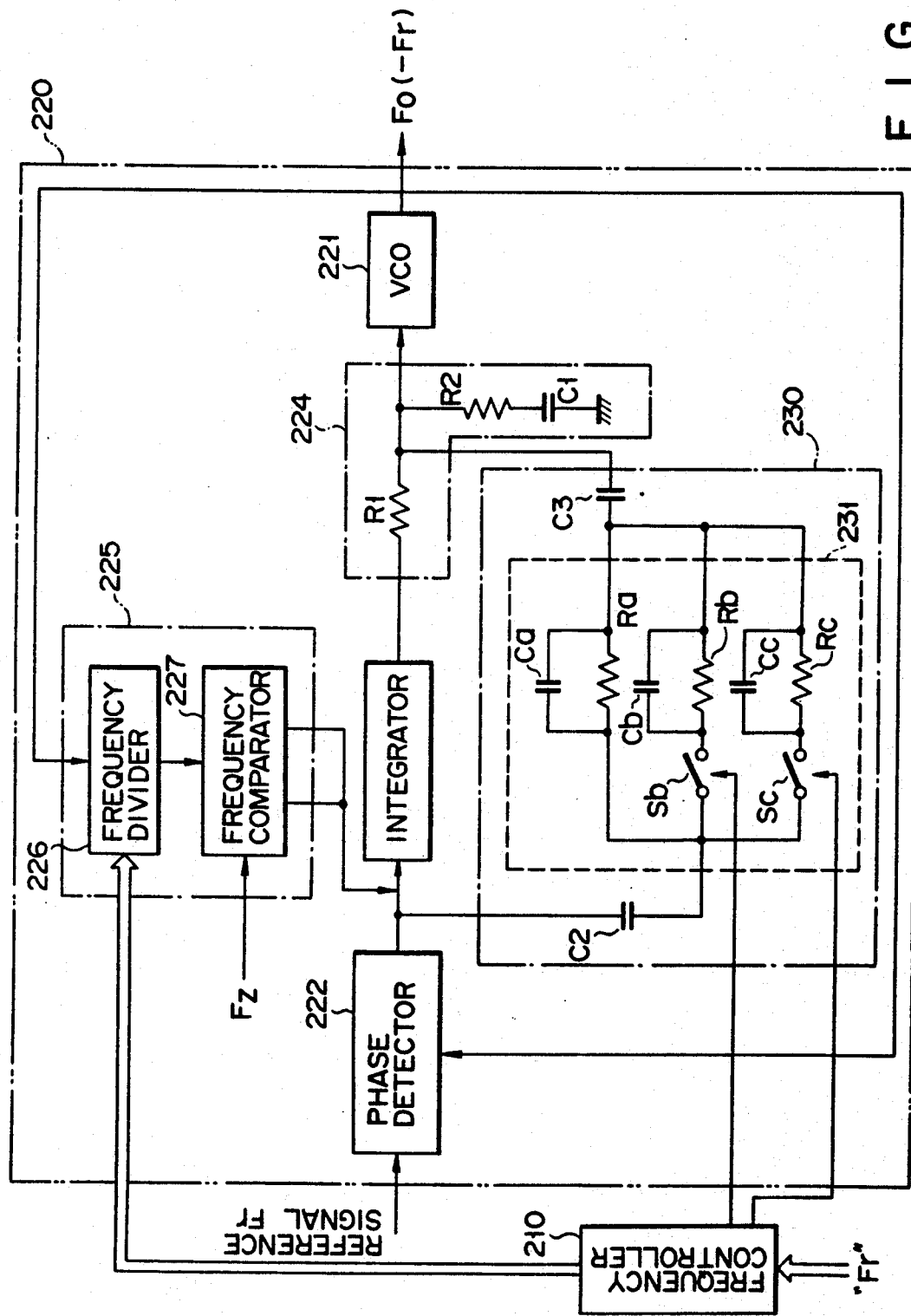
FIG. 14 is a block diagram of a PLL circuit according to a third embodiment of the present invention.

FIG. 14 is a block diagram of a frequency synthesizer using the PLL according to the present invention.

In the Figure, 210 designates a frequency control circuit for determining an output frequency of the PLL 220, which performs switching of frequency dividing factors of a frequency coarse adjustment circuit 225 to be described later and switching of a compensation circuit.

Figure 28:
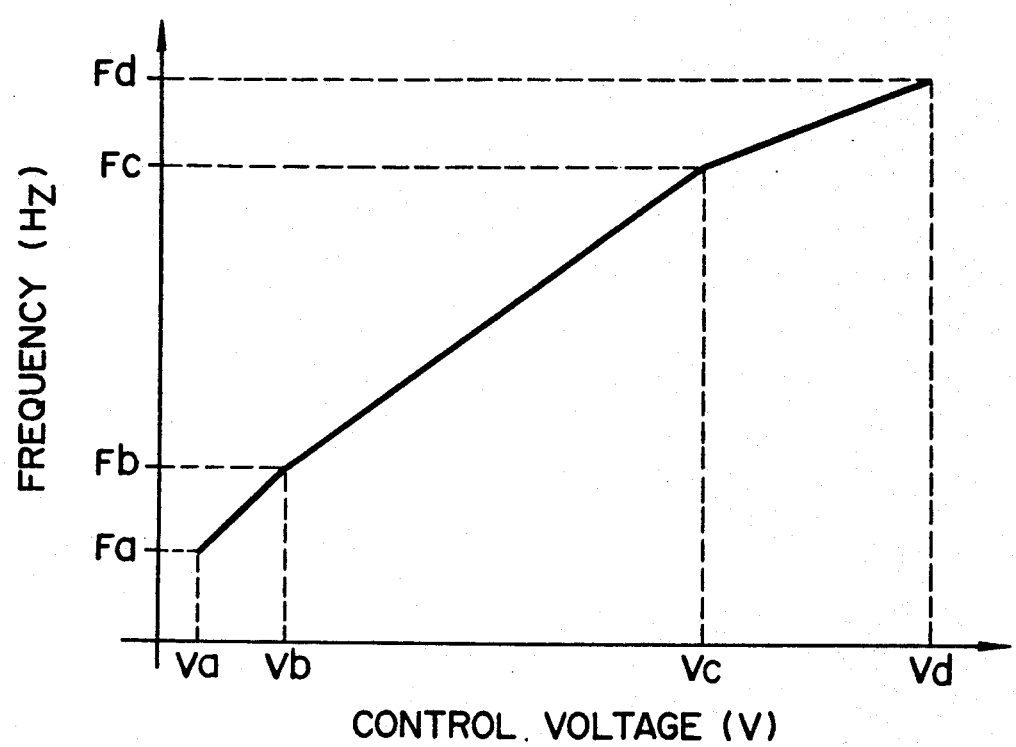
FIGS. 28 and 29 illustrate general characteristics of the VCO used in the PLL of FIG. 27.
Figure 29:
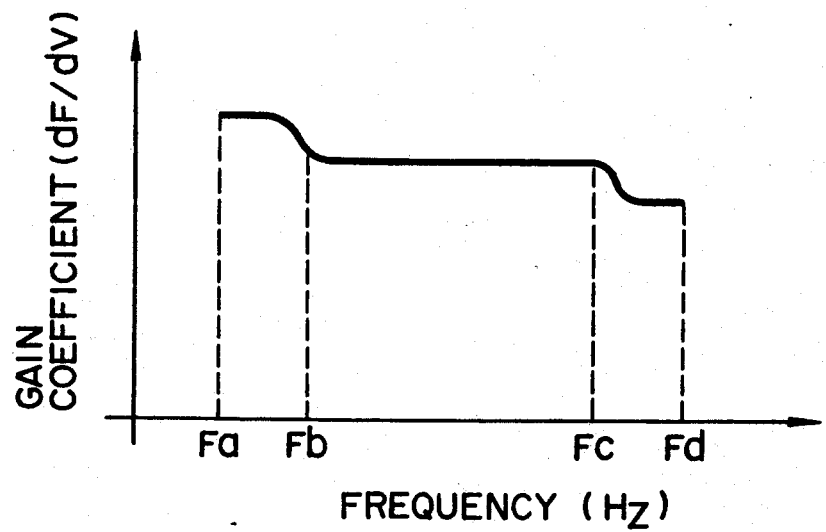
Figure 30:
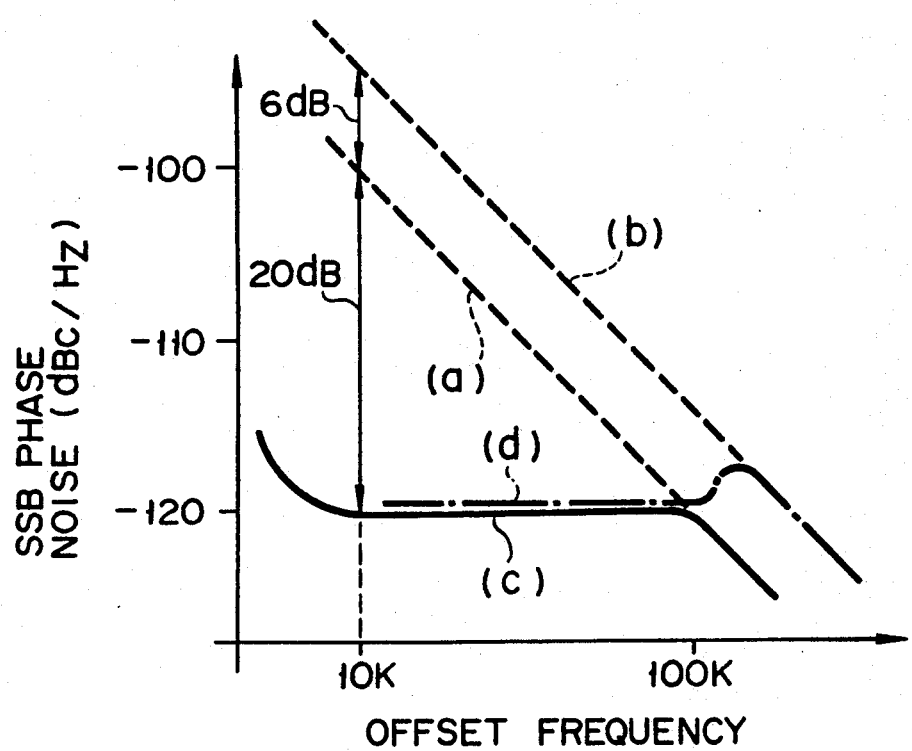
FIG. 30 is a diagram illustrating noise suppression by a conventional PLL circuit.
Figure 31:
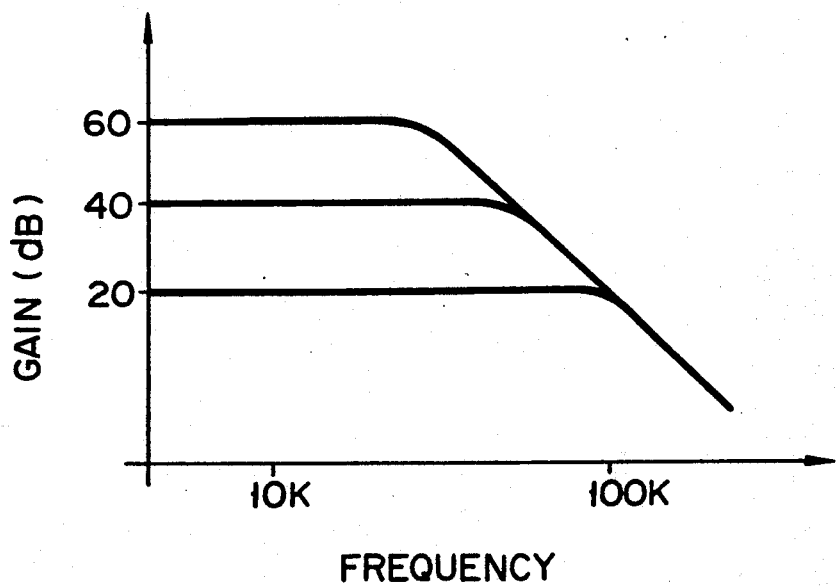
FIG. 31 illustrates characteristics of a main section of a conventional PLL.
Figure 32:
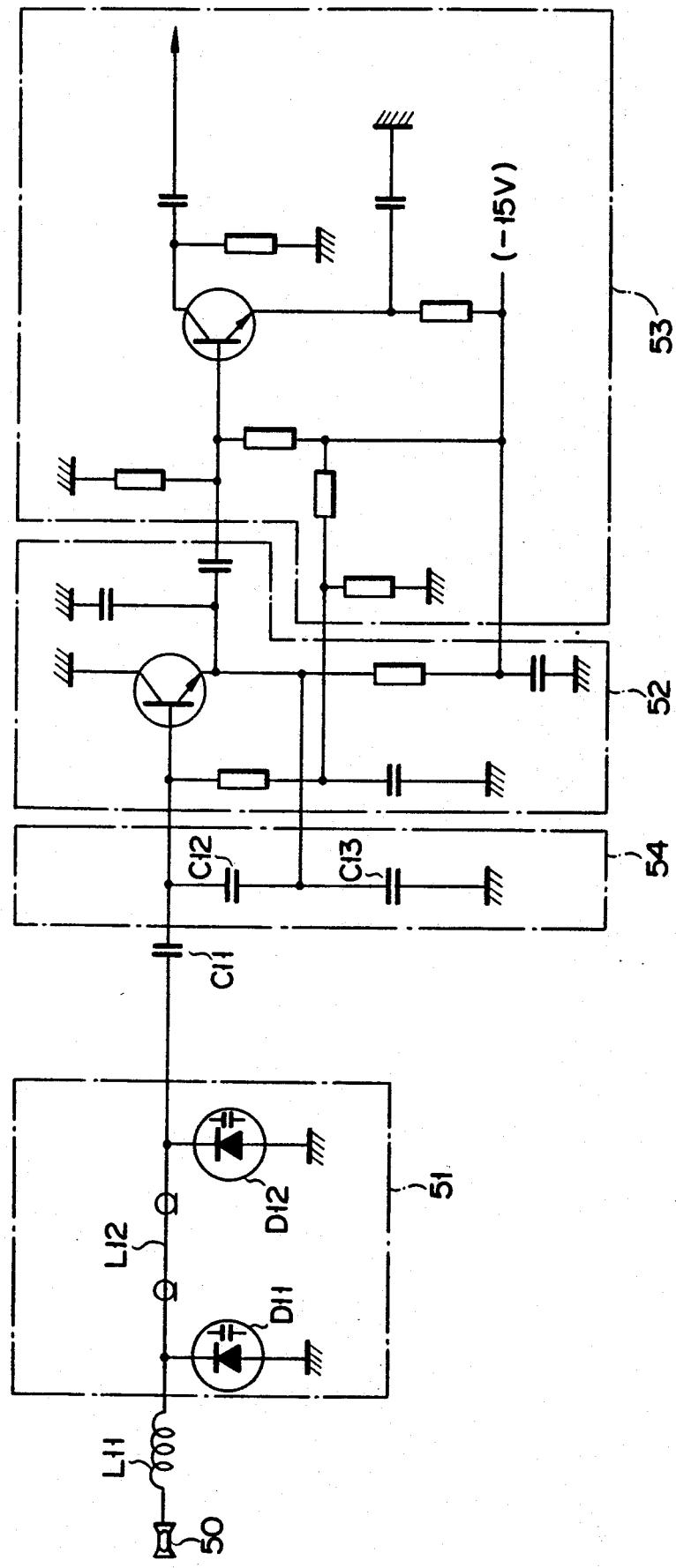
FIG. 32 illustrates the circuit arrangement of an example of a conventional voltage controlled oscillator.
Figure 33:
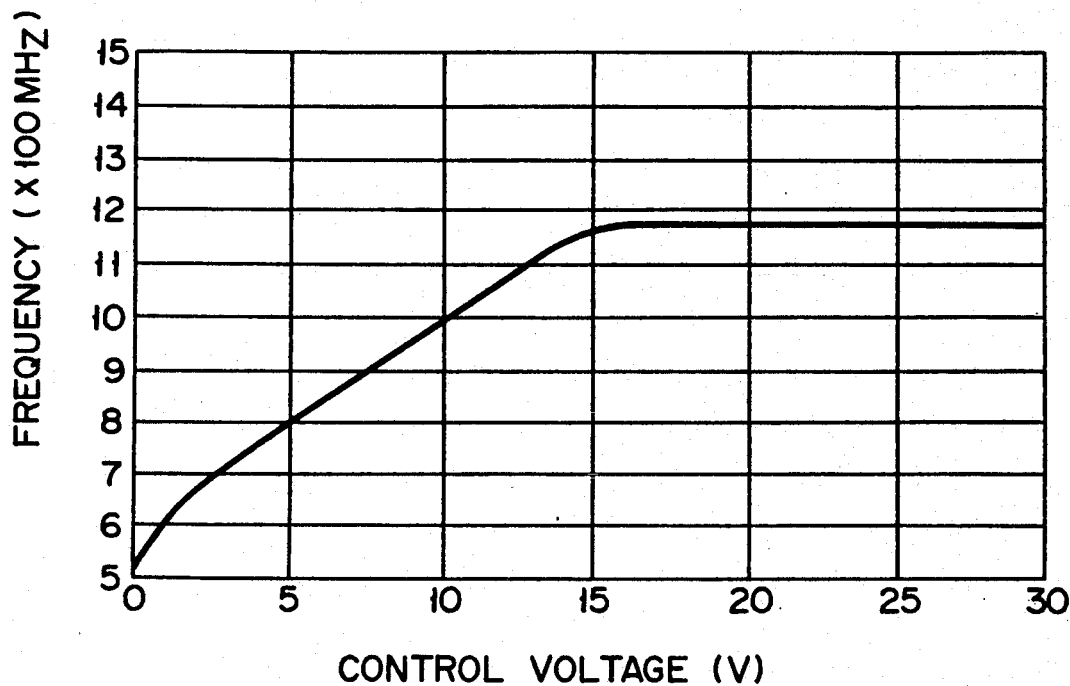
FIG. 33 illustrates the control voltage versus frequency characteristic of an oscillator used in a low frequency band.
Figure 34:
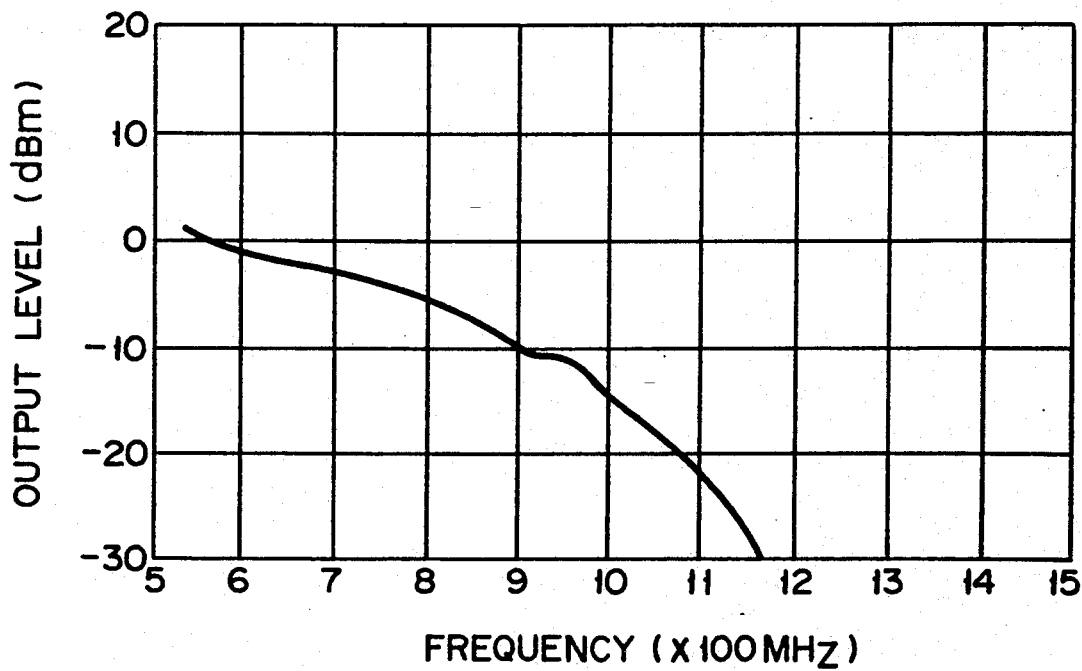
FIG. 34 illustrates the frequency versus output amplitude characteristic of an oscillator used in a low frequency band.
Figure 35:
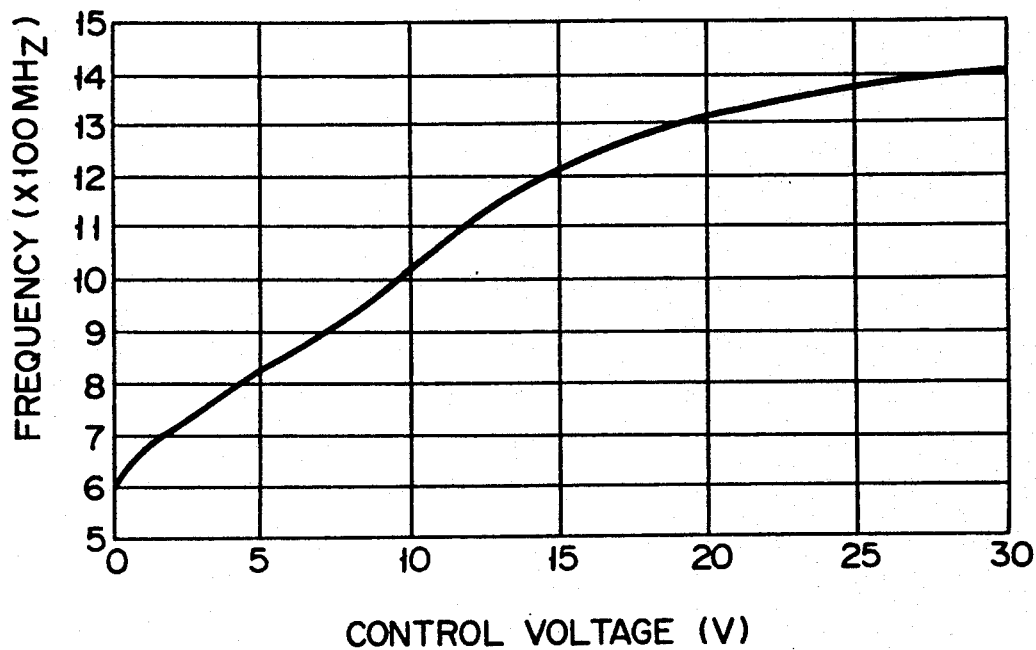
FIG. 35 illustrates the control voltage versus frequency characteristic of an oscillator used in a high frequency band.
Figure 36:
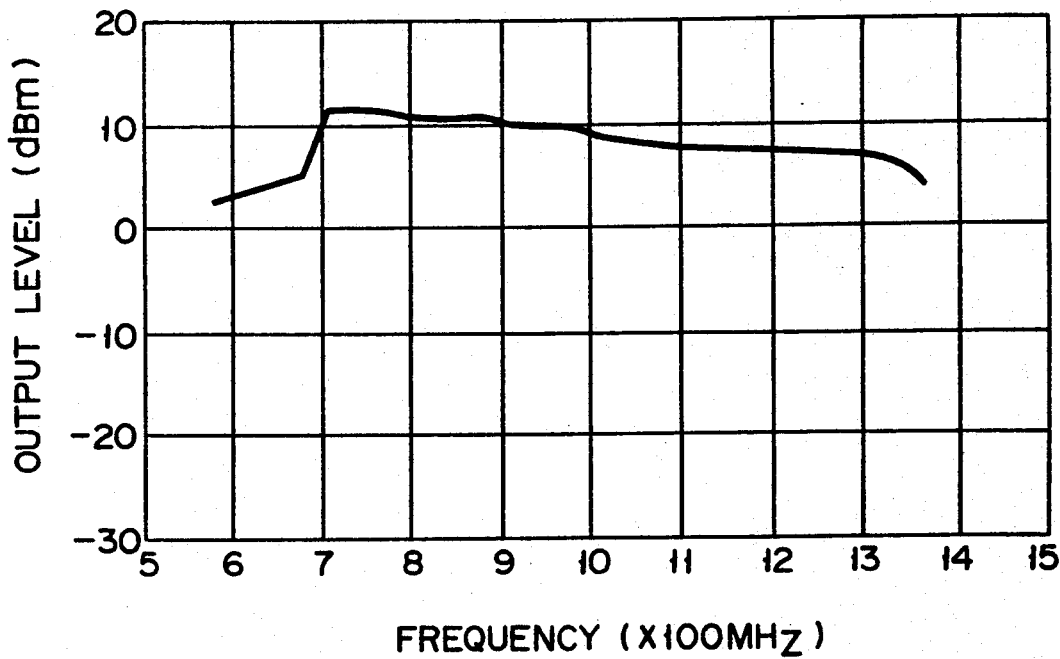
FIG. 36 illustrates the frequency versus output amplitude characteristic of an oscillator used in a high frequency band.
Figure 37:
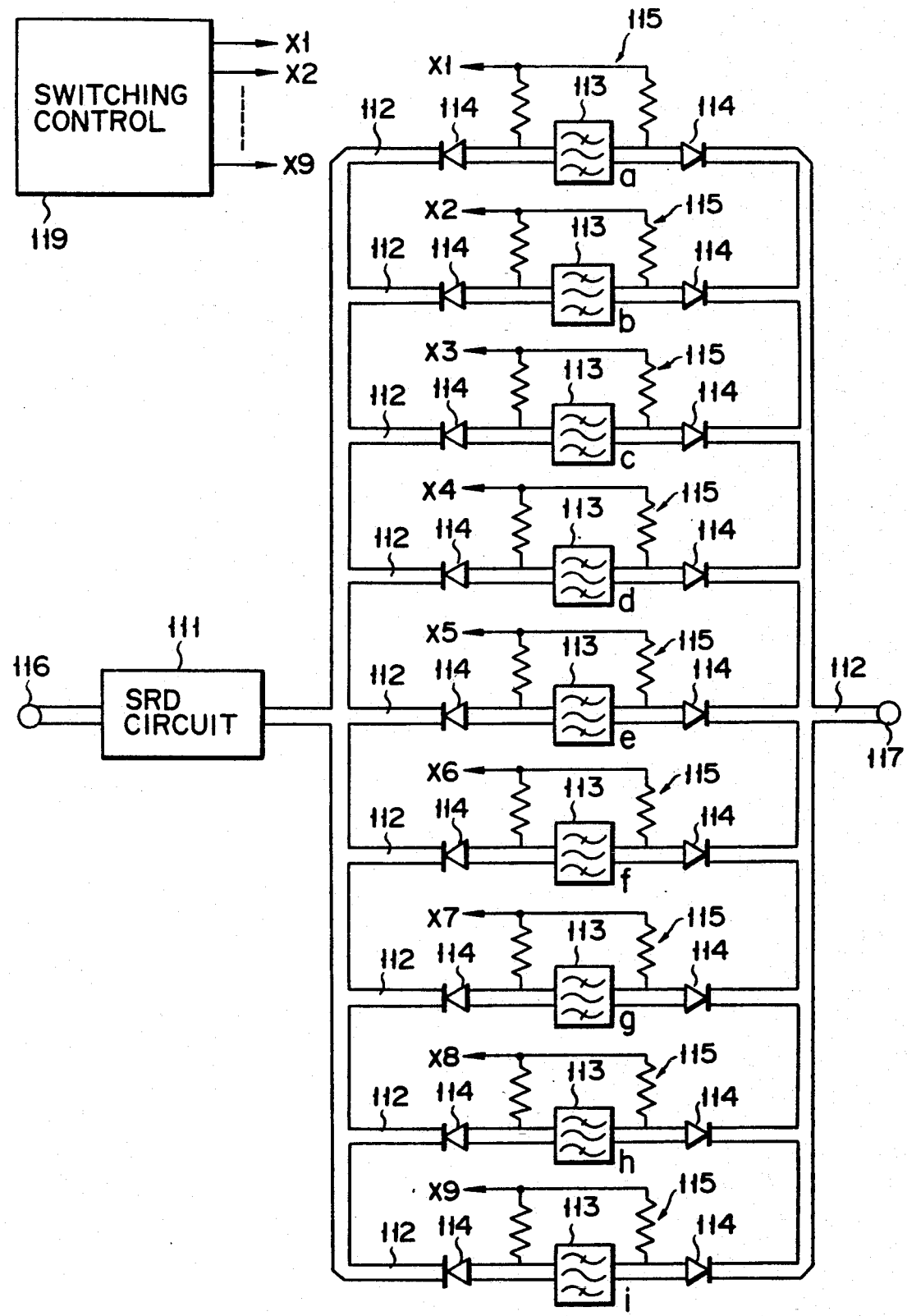
FIG. 37 is a schematic diagram of a conventional signal generator.
Figure 38:
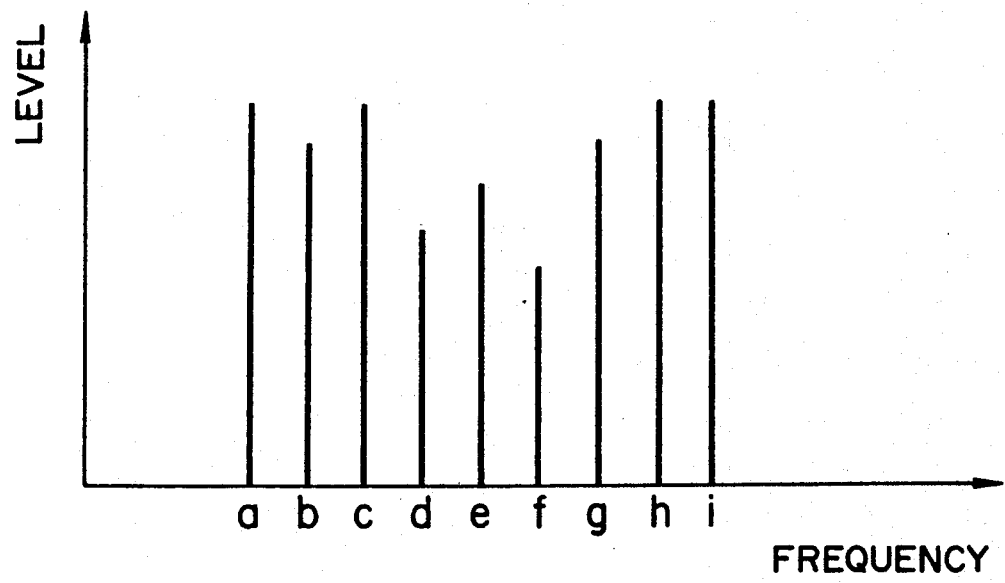
FIG. 38 illustrates the frequency versus output amplitude characteristic of a conventional signal generator.

It is assumed that a VCO 221 of the PLL 220 has the characteristics illustrated in FIGS. 28 and 29 like the VCO 31 described previously.

An output of the VCO 221 and a reference signal are applied to a mixer type phase detector 222. This reference signal is supplied from a separate circuit which generates a signal of a frequency Fr equal to frequency data set in the frequency control circuit 210.

Reference numeral 223 designates an integrator which integrates an error signal from the phase detector 222 to output a direct current voltage and consists of an operational amplifier.

The integrator 223 is made up its output phase coinciding with that of an output of an AC coupling circuit as later described. Therefore, assuming integration is performed with a single state operational amplifier, another stage operational amplifier needs to correct a converted phase of integration output (refer to the first and second amplifier 16a and 16b as shown in FIG. 12).

A lag-lead filter 224 is a loop filter which determines the loop response of the PLL 220 and produces a control voltage for the VCO 221.

The frequency detector 225 is adapted to coarsely adjust the frequency of the VCO 221 to a specified frequency. More specifically, the frequency detector 225 comprises a frequency divider 226 for dividing the VCO output frequency and a frequency comparator 227 for making comparison between the divided VCO frequency and the reference signal frequency Fz to charge or discharge the output of the integrator 223 so that their frequency difference may become smaller than a predetermined value.

230 designates an alternating current coupling circuit which capacitively couples between the phase comparator 222 and the lag-lead filter 224 by means of capacitors C2 and C3 to send only alternating current components contained in the error signal output from the phase detector 222 to the VCO 221 via the lag-lead filter 224. Between the capacitors C2 and C3 is connected a compensation circuit 231 for uniformly compensating the gain coefficient in the loop of the VCO 221.

The switching of the compensation circuit 231 is made by the frequency control circuit 210. For example, when the desired frequency Fr is set between Fa and Fb in FIG. 28, both switches Sb and Sc are kept open. With Fr set between Fb and Fc the switch Sb is closed. With Fr set between Fc and Fd, the switches Sb and SC are both closed.

Resistance values Ra, Ra//Rb and Ra//Rb//Rc are set such that the gain of the VCO 221 in the vicinity of its upper and lower limits may be equal to that in the center as shown in FIG. 15.

Capacitors Ca, Cb and Cc paralleled with resistors Ra, Rb and Rc are phase compensating capacitors for stabilizing the phase in the loop.

The values of the capacitors C1, C2 and C3 are determined such that the AC signal passing range of the alternate current coupling circuit 230 shown at f in FIG. 16 lies above the passing range of the integrator 223 indicated at e.

Thus, the pass band of signals between the phase detector 222 and the lag-lead filter 224 is substantially constant over a wide range exceeding the cutoff frequency of the integrator 223 as indicated at g in FIG. 16.

Next, the operation of the frequency synthesizer will be described.

When a frequency Fr (for example, Fc < Fr < Fd) is set in the frequency setting circuit 210, a frequency dividing factor N is set in the frequency divider 226 in the frequency detector 225 such that Fr = N × Fz.

For this reason, the frequency Fo of the VCO 221 is forcibly controlled to fall within a range from (N−1)Fz to (N+1)Fz close to Fr, compared with the reference signal with frequency Fr in phase by the phase detector 222 and then is locked to the reference signal frequency Fr by the pull-in of the PLL.

Since, at this time, the switches Sb and Sc of the compensating circuit 231 are both turned on, the apparent gain of the VCO 221 in the loop is increased by the parallel resistance value (Ra//Rb//Rc) of the resistors Ra, Rb and Rc and compensated to the same level as in the center region (FIG. 15).

The gain does not depend on the characteristic of the DC loop of the integrator 223 side but remains substantially constant over a wide range of offset frequencies because of the AC loop of the AC coupling circuit 230 side. The SSB phase noise characteristics (a) and (b) at the free-running time of the VCO 21 which vary over a range an octave or more wide ar suppressed sufficiently and to a constant level as indicated at (C), thereby producing highly pure output signals.

In the above embodiment, three compensating resistors Ra, Rb and Rc are used according the VF characteristic of the VCO 221. This is because the actual VF characteristic of the VCO is approximated by three straight lines. To compensate the gain more finely, the frequency range may be divided into more than three subranges to switch resistors for each of the subranges. In this case, instead of connecting resistors in parallel as in the above embodiment, an independent resistor may be connected for each of the frequency subranges.

Though a lag-lead filter is used as the loop filter in the above embodiment, another type of filter may be used.

In the above embodiment, the frequency detector 225 is used to synchronize the VCO output to the reference signal frequency. This is not essential to the present invention.

In the above embodiment, the VCO output is directly applied to the phase detector 222. The VCO output may be applied to the phase detector after heterodyne conversion.

As described above, the PLL according to the third embodiment of the present invention employs AC coupling as well as DC coupling between the phase detector and the VCO and a compensation circuit for compensating the apparent gain of the VCO in the AC loop. Therefore, the SSB phase suppression band relative to the offset frequency can easily be widened in the state in which the loop gain of the whole system is uniform, and highly pure signals can be output over a wide frequency variable range.

[Fourth embodiment] VCO

Figure 18:
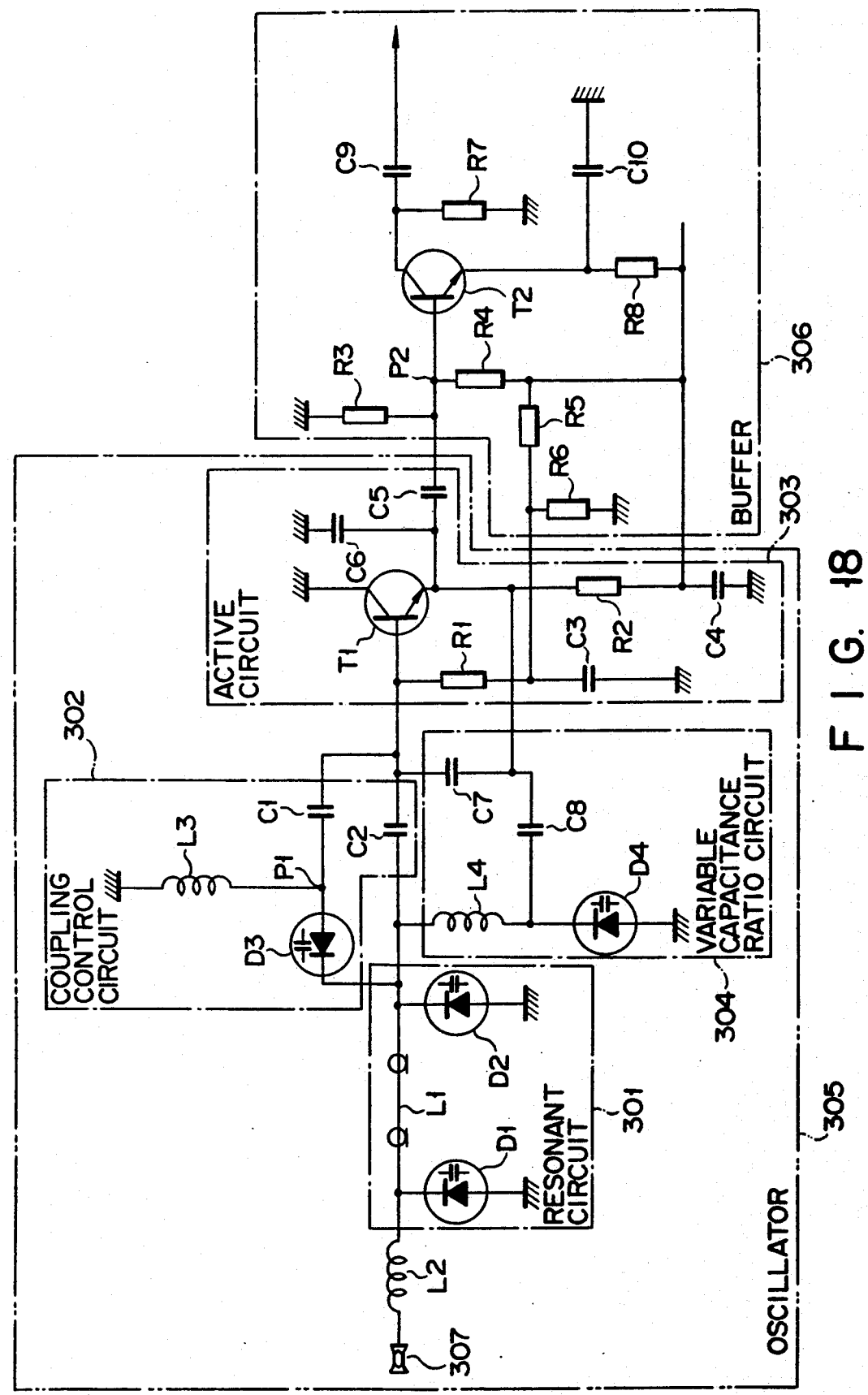
FIG. 18 illustrates a circuit arrangement of a voltage controlled oscillator according to a fourth embodiment of the present invention.

FIG. 18 is a circuit diagram of the VCO 17 of FIG. 5, namely, of a VCO incorporated in the PLL 14, which is a fourth embodiment of the present invention.

The VCO (voltage controlled oscillator) of the embodiment forms a Colpitts oscillator and is used in communication equipment requiring the band of frequencies an octave or more wide. The VCO has its output frequency controlled by an externally applied control voltage and comprises an oscillator circuit 305, which is comprised of a resonant circuit 301, a coupling control circuit 302, an active circuit 303 and a variable capacitance ratio circuit 304, and a buffer circuit 306 for taking out the output of the oscillator circuit 305.

The resonant circuit 301 comprises a coil L1 and variable capacitance diodes D1 and D2 for connecting the respective ends of the coil L1 to ground and has its input connected to an input terminal 307 via a choke coil L2 and its output connected to the coupling control circuit 302, the active circuit 303 and the variable capacitance ratio circuit 304. The variable capacitance diodes D1 and D2 have their barrier capacitances controlled by a control voltage supplied from the input terminal 307 through the choke coil L2, thereby controlling the oscillation frequency.

The coupling control circuit 302 is connected between the resonant circuit 301 and the active circuit 303 and comprises a coupling capacitor C2 and a series combination of a variable capacitance diode D3 and a capacitor C1 and a choke coil L3 connected between the junction of D3 and C1 and ground. The coupling control circuit 302 controls the barrier capacitance of the variable capacitance diode D3 through the choke coil L3 so that the resonant circuit 301 is caused a resonance with a higher frequency. That is, capacitance in the variable capacitance ratio circuit 304 and capacitance in the active circuit 303 connect to capacitance in the coupling control circuit 302 in a serial manner. An effective total capacitance for determining an oscillator frequency is capacitances of the resonant circuit 301 and capacitances added thereto. Those additional capacitances are capacitances of the coupling control circuit 302, the active circuit 303 and the variable capacitance ratio circuit 304, which capacitances are added to the resonant circuit 301. Therefore, the additional capacitance is reduced since the capacitance of the coupling control circuit 302 is reduced corresponding to the higher control voltage, then to resonate circuit 301 is caused the resonance with the higher frequency. When oscillator frequency is controlled so as to be retained lower, the resonant circuit is caused a resonance with a lower frequency according to the lower control voltage. Furthermore, in the case of capacitive coupling, the coupling strength varies with frequency because capacitor impedance with varies with frequency. For this reason, the capacitance is made small when the oscillation frequency is high and vice versa so as to make the coupling strength constant.

The active circuit 303 is coupled to the resonant circuit 301 via a coupling control circuit 302 so that it oscillates at the resonant frequency of the resonant circuit. In this example, the active circuit includes an npn transistor T1 having its base connected to ground via a series combination of a resistor R1 and a capacitor C3. The transistor T1 has its collector connected to ground and its emitter connected to a power supply via a resistor R2. Between the resistor R2 and ground is connected a capacitor C4. The emitter of the transistor T1 is connected to the buffer circuit 6 via a coupling capacitor C5. The coupling capacitor C5 has its input end connected to ground via a capacitor C6 and its output end connected to ground via a resistor R3. Between the junction point P2 between the capacitor C5 and the buffer circuit 306 and the power supply is connected a resistor R4. Between the resistor R4 and the resistor R1 connected to the base of the transistor T1 are connected resistors R5 and R6 in the form of L. The resistors R4 and R5 forms a voltage divider. In this active circuit 3, the transistor T1 oscillates at a frequency which varies with the magnitude of the control voltage applied and its output is sent to the buffer circuit 306.

The variable capacitance ratio circuit 305 has a choke coil L4 having its end connected to the input end of the coupling capacitor C2 and a capacitor C7 having its end connected to the output end of the coupling capacitor C2. A capacitor C8 is connected between the choke coil L4 and the capacitor C7. The junction between the capacitors C7 and C8 is connected to the emitter of the transistor T1. Between the choke coil L4 and ground is connected a variable capacitance diode D4 the barrier capacitance of which is controlled by the control voltage supplied from the input terminal 307. By varying the capacitance ratio of the variable capacitance diode D4 to the capacitors C7, C8, the quantity of feedback from the emitter to the base of the transistor T1, which depends on their capacitive impedances, is controlled to become constant. That is, when the capacitance of the variable capacitance diode D4 is made small when the oscillation frequency is high and vice versa so as to control the capacitance ratio of capacitor C7 to capacitor C8 and variable capacitance diode D4, whereby the quantity of feedback which depends on their capacitive impedances is made constant independently of the oscillation frequency.

The buffer circuit 306 includes an npn transistor T2 for amplifying an output signal of the active circuit T1. A capacitor C9 is connected to the collector of the transistor T2 and a resistor R7 is connected between the collector of T2 and ground. In addition, a capacitor C10 is connected between the emitter of T2 and ground, and a resistor R8 is connected between the emitter of T2 and the power supply.

With the voltage controlled oscillator constructed as described above, when a control voltage is applied to the choke coil L2, the barrier capacitances of the variable capacitance diodes D1 and D2 of the resonant circuit 301 vary so that the oscillation frequency varies. The oscillator output is taken from the active circuit 303 via the buffer circuit 306.

The quantity of feedback associated with the transistor T1 in the active circuit 303 is kept substantially constant by virtue of the variable capacitance-ratio circuit 304. That is, a control voltage raises the oscillation frequency, the capacitance of the variable capacitance diode D4 is made small, thereby making the quantity of feedback of the transistor T constant and causing the oscillation frequency to vary linearly. When the control voltage is small in magnitude and hence the oscillation frequency is low, on the other hand, the capacitance of the variable capacitance diode D4 is controlled to a large extent so as to keep the quantity of feedback of transistor T constant and stabilize the oscillation in case of higher and lower oscillation frequencies. As a result, the oscillation frequency is allowed to vary linearly.

Figure 19:
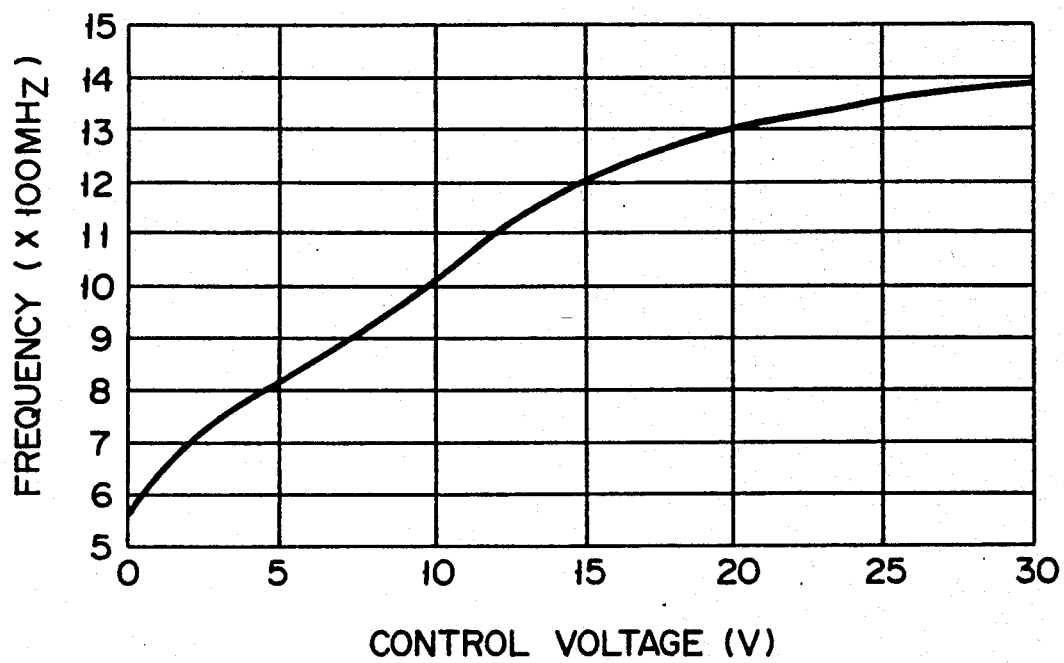
FIG. 19 illustrates the control voltage versus frequency characteristic of the voltage controlled oscillator of FIG. 18.
Figure 20:
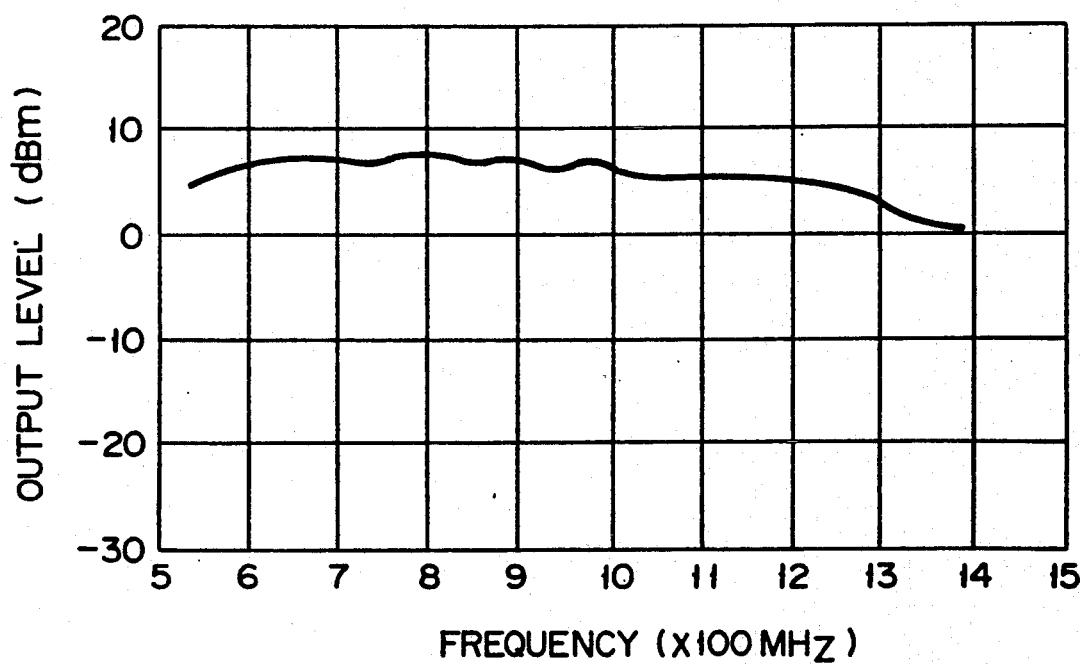
FIG. 20 illustrates the frequency versus output amplitude characteristic of the voltage controlled oscillator of FIG. 19.

FIG. 19 illustrates the control voltage versus frequency characteristic and FIG. 20 illustrates the frequency versus output level characteristic.

As can be seen from those characteristics, according to the oscillator described above, linear characteristics are obtained over a wide frequency range and the total Q is kept constant. This will also allow the C/N to be kept constant and high level oscillator outputs to be obtained.

Using a variable capacitance diode in the variable capacitance ratio circuit 304 the oscillator described above is simple in construction and inexpensive as compared with another arrangement in which a plurality of oscillators are switched by means of a switch circuit.

Though, in the above embodiment, npn transistors T1 and T2 are used in the active circuit 3 and buffer circuit 306, field effect transistors may be used instead.

[Fifth embodiment] Signal generator (SG)

Figure 21B:
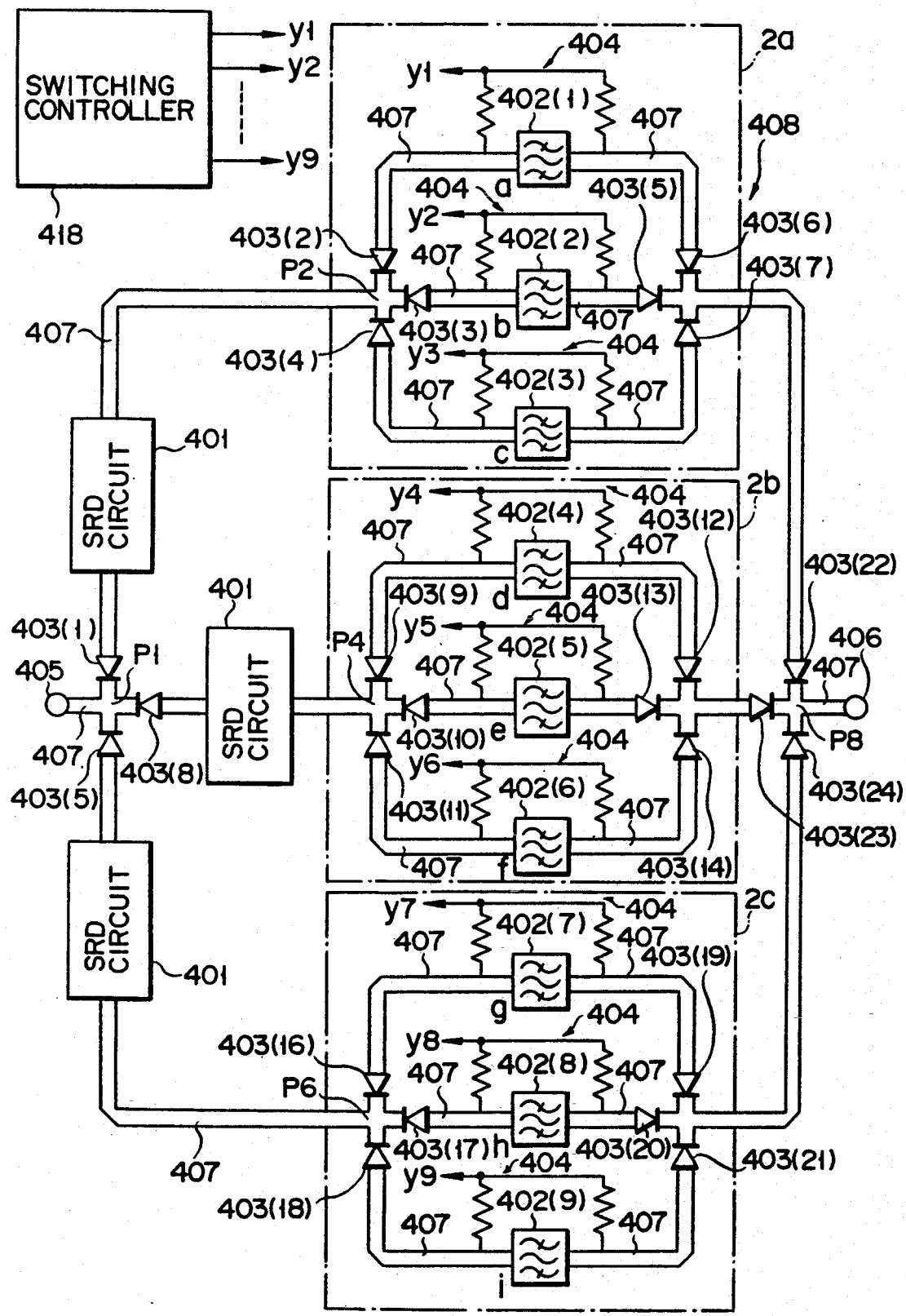
Figure 22:
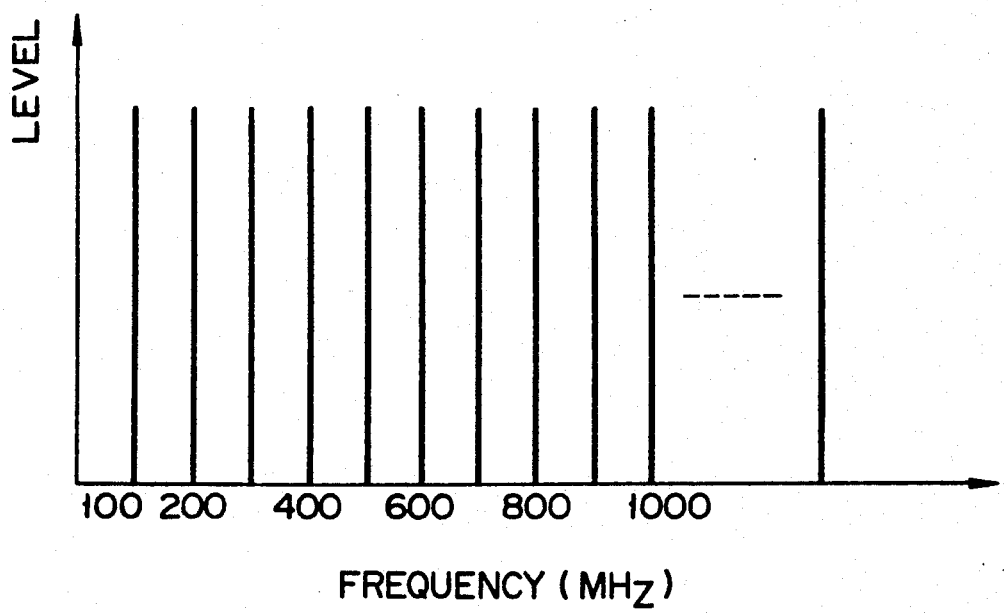
FIG. 22 illustrates the frequency versus amplitude characteristic of the SRD circuit of the signal generator of FIG. 21.
Figure 23:
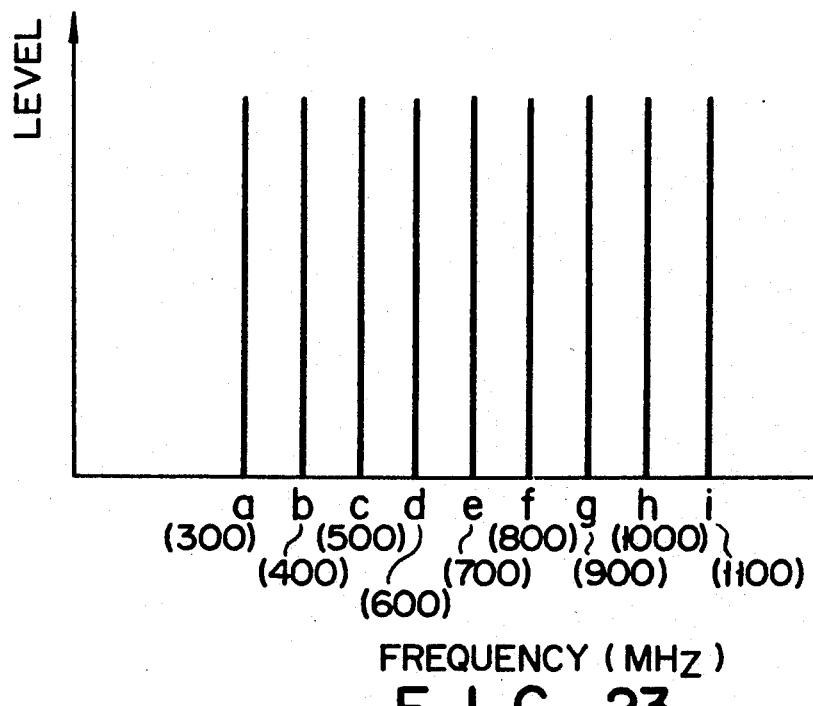
FIG. 23 illustrates the frequency versus output amplitude characteristic of the signal generator of FIG. 21.
Figure 24:
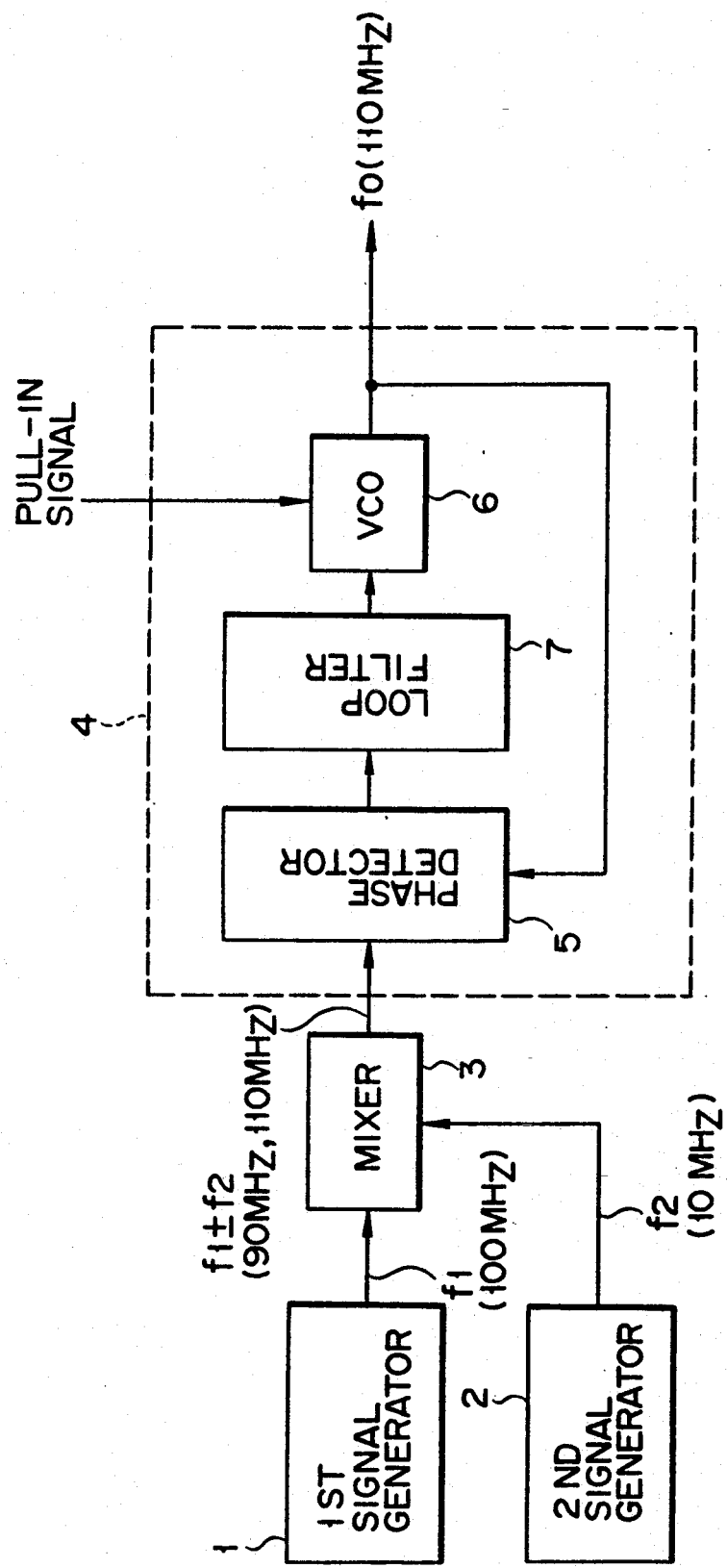
FIGS. 24 and 25 illustrate schematic arrangements of conventional frequency synthesizers.
Figure 25:
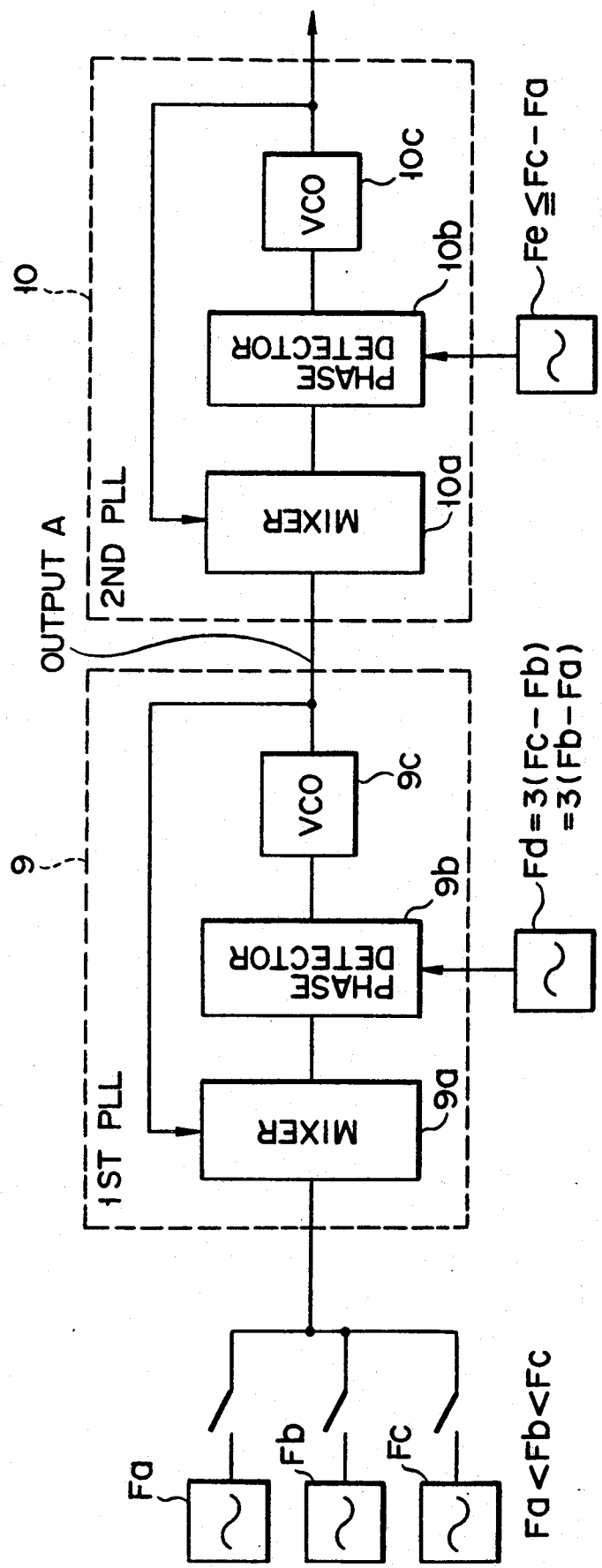

FIG. 21 is a schematic diagram of a signal generator which is a fifth embodiment of the present invention and may be used as the reference signal generator 105 of FIG. 5.

The signal generator selects a desired harmonic signal from among a plurality of harmonic signals which are multiplied by N and comprise an SRD circuit 401 serving as harmonic generating means and pattern connected on a dielectric board not shown, bandpass filters 402, pin diodes 403 and a switch circuit 404.

The SRD circuits 401 multiply a signal of a predetermined frequency (for example, 100 MHz) supplied from an input terminal 405 by N (in this embodiment N ranges from 3 to 11).

The bandpass filters 402 have their respective pass bands set to select their respective required harmonic signals from among the harmonic signals from the SRD circuit 401 and output them from an output terminal 406. The bandpass filters 402 are grouped into a plurality of sets (2a, 2b, 2c) each having plural bandpass filters connected by patterns 407, three in the embodiment, and each set of bandpass filters is connected to the SRD circuit 401 and the output terminal 406.

The output pattern 407 of the SRD circuit 401 branches into two or three separate paths, and each path further branches into two or three separate paths. This branching is repeated until the number of frequencies (paths) required is reached.

In order to shorten transmission lines and hence to reduce loss, the points at which the patterns 407 branch should be as close to the SRD circuit 401 and the output terminal 406 as possible.

The paired pin diodes 403 are connected at junction points P of patterns 407 in the opposite directions with respect to a corresponding bandpass filter 402.

Each of the pin diodes 403 is mounted to the base of an individual junction point such that the distance between the pin diode and the junction point is short relative to the passing wavelength.

Each of the switch circuits 404 is provided for a respective one of the bandpass filters 402 and makes switching of pin diodes 403 disposed on pattern 407 associated with a corresponding one of the bandpass filters 402. A positive bias voltage is applied to a control terminal 4a so that one transmission line is formed between the SRD circuit 401 and the output terminal 406. The paired pin diodes 403 on pattern 407 associated with a bandpass filter 402 supplied with the control voltage are turned on. At this time, all other pin diodes disposed on patterns 407 associated with switch circuits 404 whose control terminals are not supplied with the positive bias voltage are reverse biased so that they are off.

Since each pair of pin diodes 403 is connected to corresponding junction points P of patterns 407 in opposite directions with respect to a corresponding bandpass filter 402, when a transmission line is formed by a pair of pin diodes being turned on, the patterns associated with all other pin diodes which are in the off state are electrically cut off from the selected transmission line. This will not impose additional loading on the selected transmission line unlike the prior art. In addition, a harmonic signal of a desired frequency selected by one of bandpass filters can be obtained from the output terminal 40 without deteriorating the characteristic of the SRD circuit 401.

With the signal generator constructed as above, when a signal of a predetermined frequency is applied to the input terminal 405, the SRD circuit 401 multiplies the signal frequency by N. When a positive bias voltage is applied to the control terminal 4a of the switch circuit 404 of the second stage 2(2) in the first set 2a in FIG. 21, pin diodes 403(1), 403(3), 403(6) and 403(22) on the patterns 407 associated with the bandpass filter 2(2) connected to the said switch circuit are turned on, thereby forming one transmission line 8 between the SRD circuit 401 and the output terminal 406. At this time, other pin diodes 403(2), 403(4), 403(5), 403(7) to 403(21), 403(23) and 403(24) are all in the off state and electrically cut off from the formed transmission line 408 at junction points P of patterns 407, thereby imposing no additional loading on the transmission line 8 and thus permitting signals with high level and good frequency characteristic to be obtained.

With the present embodiment, since one transmission line 408 formed by the switching action of the switch circuit 404 to obtain a desired harmonic signal from among harmonic signals multiplied by N by the SRD circuit 401 is electrically disconnected from patterns 407 associated with all other pin diodes 403 which are in the off state at junction points P, no additional loading is imposed on the formed transmission line 408. For this reason, if any transmission line is formed, a signal with high level and good frequency characteristic can be obtained. That is, a desired harmonic signal is obtained from the output terminal 406 without deteriorating the characteristic of the SRD circuit 401.

In FIG. 21, the outputs of individual filters may be connected to other switching (not shown) directly without provision of the junction points P3 to P8.

In addition, the signal generator uses only one SRD circuit. The signal generator of the present embodiment is therefore simple in circuit construction and inexpensive as compared with the conventional signal generator having a plurality of SRD circuits. Furthermore, the space for the SRD circuit on a circuit board can be reduced to a minimum to improve packaging efficiency.

What is claimed is:

1. A voltage controlled oscillator comprising:
    resonant circuit means having at least a coil and a first variable capacitance diode, and for resonating within predetermined variable frequency ranges;
    active circuit means having an input, an output, and an active element connected between said input and said output, said input being connected to said resonant circuit means in order to receive a resonant output therefrom;
    variable capacitance ratio means having a second variable capacitance diode and at least one capacitor and connected in a positive feedback manner between said input and said output of said active circuit means in order to oscillate said active element of said active circuit means at a resonant frequency of said resonant circuit means; and
    variable control means for changing a resonant frequency of said resonant circuit means to thereby apply a control voltage to said first and second variable capacitance diodes and for controlling a capacitance ratio between said at least one capacitor and said second variable capacitance diode in said variable capacitance ratio means, so that an oscillator frequency of said active element can be changed substantially linearly over a wide bandwidth of no less than one octachord in accordance with a variation in said control voltage, to thereby retain the amount of positive feedback at a predetermined level against the oscillator frequency of said active circuit means.

2. A voltage controlled oscillator according to claim 1, wherein said coil has two ends, and said resonant circuit means includes two variable capacitance diodes respectively connected in a reverse bias manner between both ends of said coil and a standard electric potential point;
    said control voltage being supplied from another variable control means to one end of said coil; and
    said resonant output and said control voltage being extracted from another end of said coil.

3. A voltage controlled oscillator according to claim 1, wherein:
    said coil of said resonant circuit means has first and second ends;
    said at least one capacitor of said variable capacitance ratio circuit means includes first and second capacitors;
    said variable capacitance ratio circuit means includes a variable capacitance diode connected in a reverse bias manner between an end of said coil and a standard electric potential point by means of a choke coil;
    said first capacitor is connected between said input and said output of said active circuit means; and
    said second capacitor is connected between a connecting point of said variable capacitance diode and said choke coil, and said active circuit means.

4. A voltage controlled oscillator according to claim 1, further comprising:
    buffer circuit means for receiving an output from said active circuit means and for outputting said output at almost a linear level over the whole bandwidth of the oscillatory frequency of said active element.

5. A voltage controlled oscillator comprising:
    resonant circuit means having at least a coil and a first variable capacitance diode, and for resonating within predetermined variable frequency ranges;
    active circuit means having an input, an output, and an active element connected between said output and said input, said input being connected to said resonant circuit means in order to receive a resonant output therefrom;
    coupling control means having a first capacitor for connecting at least said resonant circuit means to said active circuit means as a capacitance coupling, and a second variable capacitance diode for adjusting the strength of said capacitance coupling in accordance with a resonant frequency of said resonant circuit means;
    variable capacitance ratio means having at least a third variable capacitance diode and a second capacitor connected in a positive feedback manner between said input and said output of said active circuit means in order to oscillate said active element of said active circuit means at a resonant frequency of said resonant circuit means; and
    variable control means for changing a resonant frequency of said resonant circuit means to thereby apply a control voltage to said first, second and variable capacitance diodes and for controlling a capacitance ratio between said first capacitor and said second variable capacitance diode of said variable capacitance ratio means, so that an oscillator frequency of said active element can be changed substantially linearly over a wide bandwidth of no less than one octachord in accordance with a variation in said control voltage, to thereby retain the strength of the capacitance coupling between said resonant circuit means and said active circuit means substantially at a predetermined level in accordance with a resonant frequency of said resonant circuit means and to retain an amount of positive feedback at a predetermined value against the oscillator frequency of said active element.

6. A voltage controlled oscillator according to claim 5, wherein said coil has two ends, and said resonant circuit means includes:
    two variable capacitance diodes respectively connected between both ends of said coil and a standard electric potential point;
    said control voltage from said variable control means being applied to one end of said coil; and
    said control voltage and said oscillator output being extracted from another end of said coil.

7. A voltage controlled oscillator according to claim 6 wherein said coupling means includes:
    a variable capacitance diode arranged in a reverse bias manner and connected in series with a third capacitor and between said another end of said coil and said standard electric potential point;
    a choke coil connected to said variable capacitance diode; and
    a third capacitor connected between said input of said active circuit means and a connecting point of said variable capacitance diode and said choke coil.

8. A voltage controlled oscillator according to claim 6 wherein:

said third variable capacitance diode is connected in a reverse bias manner between said another end of said coil and said standard electric potential point by means of a choke coil; and said variable capacitance ratio means further includes:

a fourth capacitor connected between said input and said output of said active circuit means; and a fifth capacitor connected between the connecting point of said choke coil and said variable capacitance diode, and said active circuit means.

9. A voltage controlled oscillator according to claim 5, further comprising:

buffer circuit means for receiving an output from said active circuit means and for outputting said output at almost a linear level over the whole bandwidth of the oscillatory frequency of said active element.

* * * * *

UNITED STATES PATENT AND TRADEMARK OFFICE
CERTIFICATE OF CORRECTION

PATENT NO. : 5,160,902
DATED : November 3, 1992
INVENTOR(S) : Hiroshi Saeki et al It is certified that error appears in the above-identified patent and that said Letters Patent is hereby corrected as shown below:

On the title page:

Item: [75], under Inventors, delete "Hatsuo Motoyama".

Section [56], References Cited, under the heading "U.S. PATENT DOCUMENTS" add:
```
--4,595,886   6/1986    Mroch
  4,885,553   12/1989   Hietala et al
  5,015,970   5/1991    Williams et al
  5,036,295   7/1991    Kamitani
  5,053,724   10/1991   Ogino et al
  4,905,239   2/1990    Lockwood et al
  3,568,034   3,1971    Shenfeld--
```

Signed and Sealed this

Fifteenth Day of March, 1994

Attest:

BRUCE LEHMAN

Attesting Officer

Commissioner of Patents and Trademarks